(12) United States Patent
Park et al.

(10) Patent No.: US 7,479,416 B2
(45) Date of Patent: Jan. 20, 2009

(54) THIN FILM TRANSISTOR ARRAY PANEL AND MANUFACTURING METHOD THEREOF

(75) Inventors: Kyung-Min Park, Gyeonggi-do (KR); Jin-Goo Jung, Seoul (KR); Chun-Gi You, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 201 days.

(21) Appl. No.: 11/330,312

(22) Filed: Jan. 10, 2006

(65) Prior Publication Data

US 2006/0157836 A1    Jul. 20, 2006

(30) Foreign Application Priority Data

Jan. 18, 2005    (KR)    .................... 10-2005-0004670

(51) Int. Cl.
*H01L 21/00*    (2006.01)
(52) U.S. Cl. ............... 438/149; 438/706; 257/E21.094; 257/E21.226
(58) Field of Classification Search ................ 438/149, 438/706, 725; 257/E21.094, E21.226
See application file for complete search history.

(56) References Cited

U.S. PATENT DOCUMENTS 6,001,539 A * 12/1999 Lyu et al. .................... 430/317

FOREIGN PATENT DOCUMENTS

| | | |
|---|---|---|
| CN | 1397829 | 2/2003 |
| CN | 1148600 | 5/2004 |
| CN | 1521806 | 8/2004 |
| JP | 10022270 | 1/1998 |
| JP | 2000331951 | 11/2000 |
| JP | 2001250795 | 9/2001 |
| JP | 2002094013 | 3/2002 |
| JP | 2003273120 | 9/2003 |
| JP | 2004140407 | 5/2004 |
| KR | 100161461 | 8/1998 |
| KR | 1019990061316 | 7/1999 |
| KR | 100264818 | 6/2000 |
| KR | 1020010003140 | 1/2001 |
| KR | 2001-0015895 | 2/2001 |

\* cited by examiner

*Primary Examiner*—Charles D. Garber
*Assistant Examiner*—Stanetta D Isaac
(74) *Attorney, Agent, or Firm*—Cantor Colburn LLP

(57) ABSTRACT

A method of manufacturing a thin film transistor array panel is provided, which includes: forming a thin film transistor including a gate electrode, a drain electrode, a source electrode and a semiconductor on a substrate; forming a first passivation layer on the drain and the source electrodes; forming a transparent conductive layer on the first passivation layer; etching the transparent conductive layer using a photoresist as an etch mask to expose the portion of the first passivation layer and to form a pixel electrode connected the drain electrode; ashing the first passivation layer and the photoresist; and removing the photoresist.

11 Claims, 43 Drawing Sheets

THIN FILM TRANSISTOR ARRAY PANEL AND MANUFACTURING METHOD THEREOF

BACKGROUND OF THE INVENTION (a) Field of the Invention

The present invention relates to a thin film transistor array panel and a method for manufacturing thereof.

(b) Description of the Related Art

Generally, as a semiconductor device becomes integrated, the semiconductor device is optimized in its area while bearing a multi-layered wiring line assembly together with an interlayer insulating layer. It is desirable that the interlayer insulating layers are made of materials with low permittivity in order to minimize the interference between signals flowing through the different wires, and different layers of wires transmitting the same signals are electrically connected to each other through contact holes provided at the interlayer insulating layers.

A flat panel display such as a liquid crystal display (LCD) and an organic light emitting display (OLED) includes a thin film transistor array panel to separately control a plurality of pixels, and an organic insulating layer for an interlayer insulator. In particular, a pixel electrode of the flat panel display overlaps the wires to improve an aperture ratio, and the insulating layer disposed between the pixel electrode and the wires is made of materials with low permittivity in order to minimize the parasitic capacitance therebetween.

The organic insulating layer has photo sensitivity, and only exposed and developed to form a predetermined pattern without an etch steps.

However, the charges come together at the exposed surface of the organic insulating layer after processing such as etch steps and Ar plasma treatments such that the charges cause afterimage during the operation of the LCD.

SUMMARY OF THE INVENTION

A method of manufacturing a thin film transistor array panel is provided, which includes: forming a thin film transistor including a gate electrode, a drain electrode, a source electrode and a semiconductor on a substrate; forming a first passivation layer on the drain and the source electrodes; forming a transparent conductive layer on the first passivation layer; etching the transparent conductive layer using a photoresist as an etch mask to expose the portion of the first passivation layer and to form a pixel electrode connected the drain electrode; ashing the first passivation layer and the photoresist; and removing the photoresist.

The ashing of the transparent conductive layer and the first passivation layer may be preformed until the exposed surface of the first passivation layer from the pixel electrode is lower than the surface of the first passivation layer under the pixel electrode.

The first passivation layer may include an organic material, and the formation of the thin film transistor further may include a formation of a second passivation layer.

The second passivation layer may include an inorganic material.

The method may further include a formation an ohmic contact layer between the semiconductor and the source and the drain electrodes.

The formation of the source and the drain electrode, the ohmic contact layer, and the semiconductor may include: depositing an intrinsic silicon layer and an extrinsic silicon layer; etching the intrinsic silicon layer and the extrinsic silicon layer to form the semiconductor and the extrinsic semiconductor; forming a conductor layer; etching the conductor layer to form the source and the drain electrodes; and etching the extrinsic semiconductor exposed between the source electrode and the drain electrode to form the ohmic contact layer.

The formation of the data line and the drain electrode, the ohmic contact layer, and the semiconductor may include: depositing an intrinsic silicon layer and an extrinsic silicon layer; forming a conductor layer on the extrinsic silicon layer etching the intrinsic silicon layer and the extrinsic silicon layer to form the semiconductor and the extrinsic semiconductor; etching the conductor layer to form the source and the drain electrodes; and etching the extrinsic semiconductor exposed between the source electrode and the drain electrode to form the ohmic contact layer.

A method of manufacturing a thin film transistor array panel is provided, which includes: forming a semiconductor including extrinsic regions and intrinsic regions; forming a gate insulating layer covering the semiconductor; forming a gate line overlapping the intrinsic regions of the semiconductor; forming an interlayer insulating layer covering the gate line and the gate insulating layer; forming a data line and a drain electrode respectively connected to the extrinsic regions of the semiconductor; forming a passivation layer covering the data line and the drain electrode; forming a transparent conductive layer on the passivation layer; etching the transparent conductive layer using a photoresist as an etch mask to expose the portion of the passivation layer and to form a pixel electrode connected the drain electrode; ashing the passivation layer and the photoresist; and removing the photoresist.

The ashing of the transparent conductive layer and the passivation layer may be preformed until the exposed surface of the passivation layer from the pixel electrode is lower than the surface of the passivation layer under the pixel electrode.

The passivation layer may include an organic material.

A thin film transistor array panel is provided, which include: an insulating substrate; a thin film transistor including a gate electrode, a drain electrode, a source electrode and a semiconductor and formed on the insulating substrate; a first passivation layer formed on the drain and the source electrodes, including a first portion and a second portion, and a first contact hole; and a pixel electrode formed on the first portion of the first passivation layer and connected to the drain electrode through the first contact hole, wherein the surface of second portion is lower than the surface of the first portion of the first passivation under the pixel electrode.

The first passivation layer may include an organic material, and the first passivation layer may have photosensitivity.

The thin film transistor array panel may further include: a second passivation layer formed under the first passivation layer, and a second contact hole located at the position corresponding to the first contact hole.

The second passivation layer includes silicon nitride, and the semiconductor may include extrinsic semiconductor and intrinsic semiconductor.

A thin film transistor array panel is provided, which include: an insulating substrate; a semiconductor including extrinsic regions and intrinsic regions and formed on the insulating substrate; a gate insulating layer covering the semiconductor; a gate line overlapping the intrinsic regions of the semiconductor and formed on the gate insulating layer; an interlayer insulating layer covering the gate line and the gate insulating layer; a data line including a source electrode and a drain electrode separated from the data line, formed on the interlayer insulating layer; a first passivation layer formed on the data line and the drain electrodes, including a first portion and a second portion, and a first contact hole; and a pixel electrode formed on the first portion of the first passivation layer and connected to the drain electrode through the first contact hole, wherein the surface of second portion is lower than the surface of the first portion of the first passivation under the pixel electrode.

The first passivation layer may include an organic material, and the first passivation layer has photosensitivity.

BRIEF DESCRIPTION OF THE DRAWINGS

The above and other advantages of the present invention will become more apparent by describing preferred embodiments thereof in detail with reference to the accompanying drawings in which.

DETAILED DESCRIPTION OF EMBODIMENTS

Figure 1:
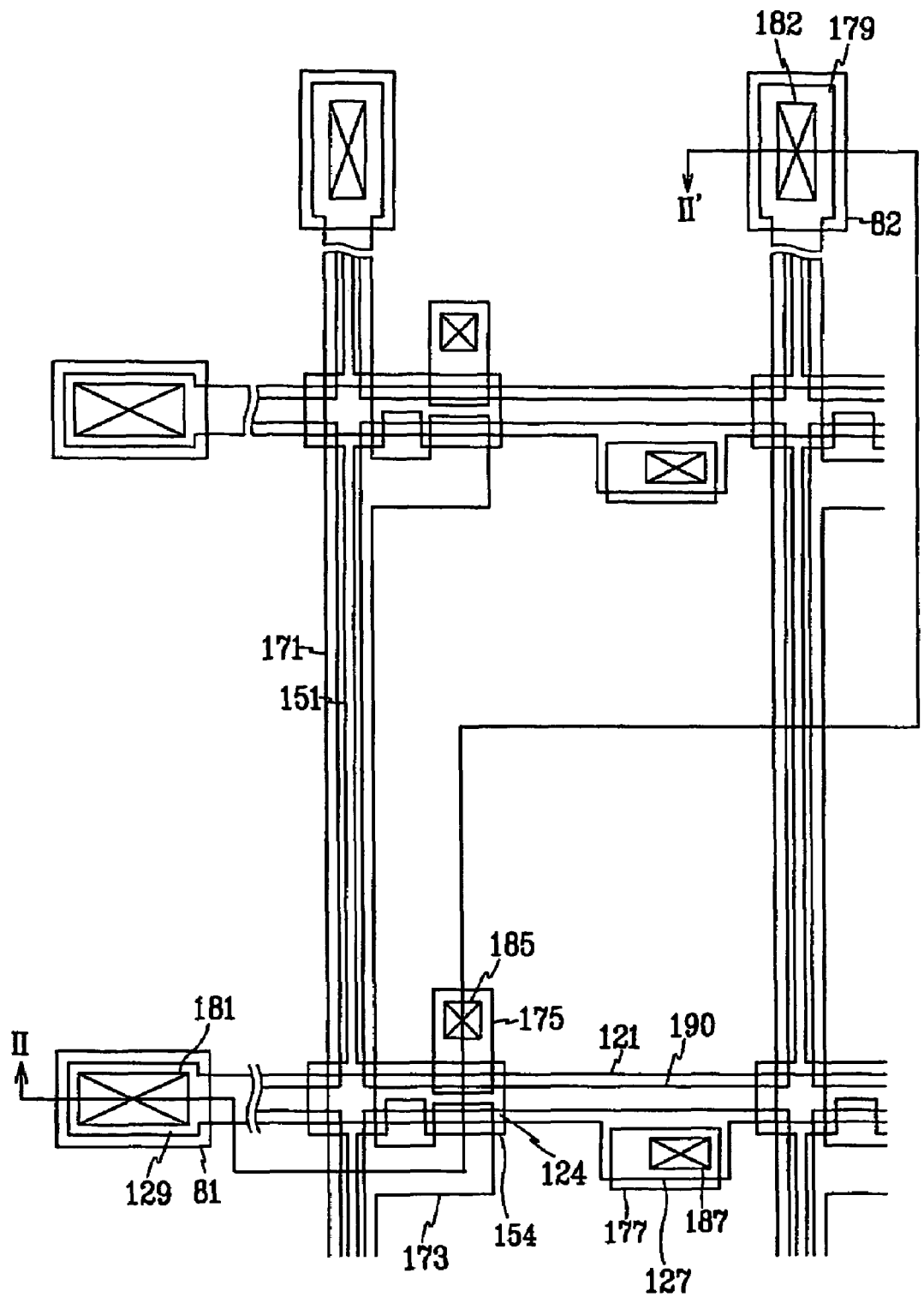
FIG. 1 is a layout view of a TFT array panel for an LCD according to an embodiment of the present invention.

The present invention will now be described more fully hereinafter with reference to the accompanying drawings, in which preferred embodiments of the invention are shown. The present invention may, however, be embodied in many different forms and should not be construed as limited to the embodiments set forth herein.

In the drawings, the thickness of layers, films and regions are exaggerated for clarity. Like numerals refer to like elements throughout. It will be understood that when an element such as a layer, film, region or substrate is referred to as being "on" another element, it can be directly on the other element or intervening elements may also be present. In contrast, when an element is referred to as being "directly on" another element, there are no intervening elements present.

Now, a TFT array panels and manufacturing methods thereof according to embodiments of the present invention will be described with reference to the accompanying drawings.

First, a TFT array panel for an LCD will be described in detail with reference to FIGS. 1 to 2.

Figure 2:
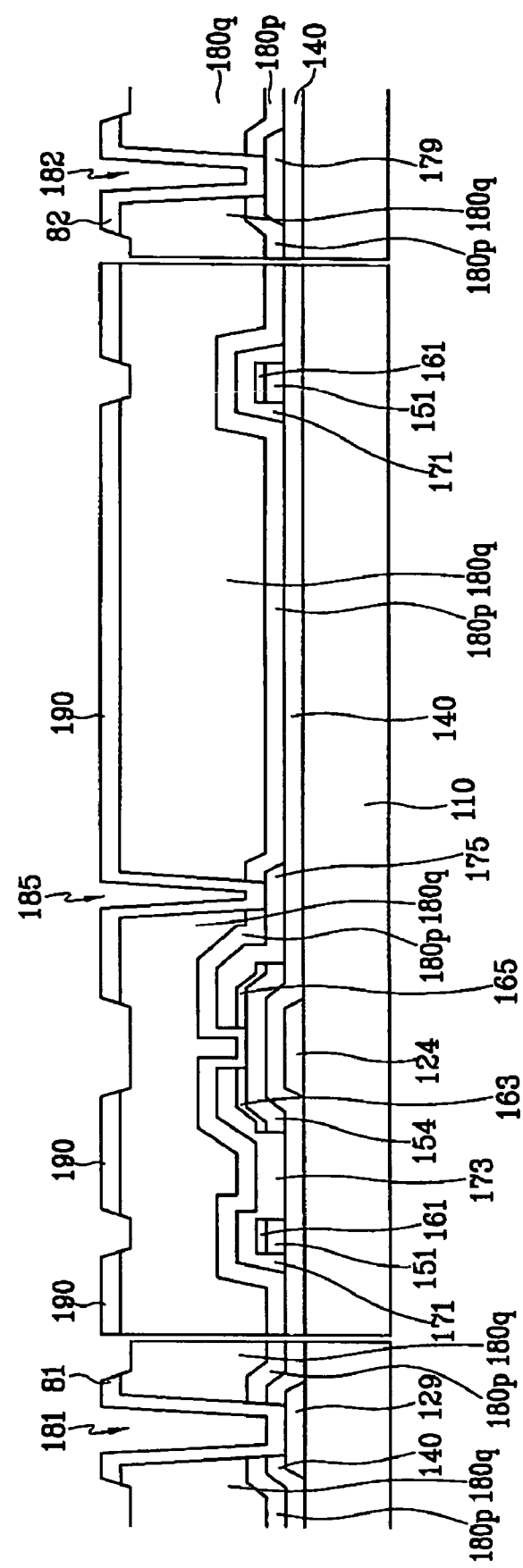
FIG. 2 is a sectional view of the TFT array panel shown in FIG. 1 taken along the lines II-II'.

FIG. 1 is a layout view of a TFT array panel for an LCD according to an embodiment of the present invention, and FIG. 2 is a sectional view of the TFT array panel shown in FIG. 1 taken along the lines II-II'.

A plurality of gate lines 121 are formed on an insulating substrate 110 such as transparent glass.

The gate lines 121 extend substantially in a transverse direction and are separated from each other and transmit gate signals. Each gate line 121 includes a plurality of projections forming a plurality of gate electrodes 124, a plurality of projections 127 protruding downward and an end portion 129 having a large area for contact with another layer or an external driving circuit. The gate lines 121 may extend to be connected to a driving circuit that may be integrated on the insulating substrate 110.

The gate lines 121 are preferably made of Al containing metal such as Al and Al alloy, Ag containing metal such as Ag and Ag alloy, Cu containing metal such as Cu and Cu alloy, Mo containing metal such as Mo and Mo alloy, Cr, Ti or Ta. The gate lines 121 may have a multi-layered structure including two films having different physical characteristics. One of the two films is preferably made of low resistivity metal including Al containing metal for reducing signal delay or voltage drop in the gate lines 121. The other film is preferably made of material such as Cr, Mo and Mo alloy, Ta or Ti, which has good physical, chemical, and electrical contact characteristics with other materials such as indium tin oxide (ITO) or indium zinc oxide (IZO). Good examples of the combination of the two films are a lower Cr film and an upper Al (Al—Nd alloy) film and a lower Al (Al alloy) film and an upper Mo film.

In addition, the lateral sides of the gate line 121 are tapered, and the inclination angle of the lateral sides with respect to a surface of the substrate 110 ranges about 30-80 degrees.

A gate insulating layer 140 preferably made of silicon nitride (SiNx) is formed on the gate lines 121.

A plurality of semiconductor stripes 151 preferably made of hydrogenated amorphous silicon (abbreviated to "a-Si") are formed on the gate insulating layer 140. Each semiconductor stripe 151 extends substantially in a longitudinal direction and has a plurality of projections 154 branched out toward the gate electrodes 124. The width of each semiconductor stripe 151 becomes large near the gate lines 121 such that the semiconductor stripe 151 covers large areas of the gate lines 121.

A plurality of ohmic contact stripes and islands 161 and 165 preferably made of silicide or n+ hydrogenated a-Si heavily doped with n type impurity are formed on the semiconductor stripes 151. Each ohmic contact stripe 161 has a plurality of projections 163, and the projections 163 and the ohmic contact islands 165 are located in pairs on the projections 154 of the semiconductor stripes 151.

The lateral sides of the semiconductor stripes 151 and the ohmic contacts 161 and 165 are tapered, and the inclination angles thereof are preferably in a range between about 30-80 degrees.

A plurality of data lines 171, a plurality of drain electrodes 175 and a plurality of storage capacitor conductors 177 are formed on the ohmic contacts 161 and 165 and the gate insulating layer 140.

The data lines 171 for transmitting data voltages extend substantially in the longitudinal direction and intersect the gate lines 121. Each data line 171 includes an expansion 179 having a larger area for contact with another layer or an external device.

A plurality of branches of each data line 171, which project toward the drain electrodes 175, form a plurality of source electrodes 173. Each pair of the source electrodes 173 and the drain electrodes 175 are separated from each other and opposite each other with respect to a gate electrode 124. A gate electrode 124, a source electrode 173, and a drain electrode 175 along with a projection 154 of a semiconductor stripe 151 form a TFT having a channel formed in the projection 154 disposed between the source electrode 173 and the drain electrode 175.

The storage capacitor conductors 177 overlap the projections 127 of the gate lines 121.

The data lines 171, the drain electrodes 175, and the metal pieces 178 are preferably made of refractory metal such as Cr, Mo, Ti, Ta or alloys thereof. However, they may also have a multilayered structure including a low-resistivity film (not shown) and a good-contact film (not shown). A good example of the combination is a lower Mo film, an intermediate Al film and an upper Mo film, or a lower Ti film (or TiNx), an intermediate Al film (or Al—Nd alloy), and an upper Ti film (or TiNx) as well as the above-described combinations of a lower Cr film and an upper Al-Nd alloy film and a lower Al film and an upper Mo film.

Like the gate lines 121, the data lines 171 and the drain electrodes 175 have tapered lateral sides, and the inclination angles thereof range about 30-80 degrees.

The ohmic contacts 161 and 165 are interposed only between the underlying semiconductor stripes 151 and the overlying data lines 171 and the overlying drain electrodes 175 thereon and reduce the contact resistance therebetween. The semiconductor stripes 151 include a plurality of exposed portions, which are not covered with the data lines 171 and the drain electrodes 175, such as portions located between the source electrodes 173 and the drain electrodes 175. Although the semiconductor stripes 151 are narrower than the data lines 171 at most places, the width of the semiconductor stripes 151 becomes large near the gate lines 121 as described above, to smooth the profile of the surface, thereby preventing the disconnection of the data lines 171.

A lower passivation layer 180p preferably made of inorganic material such as silicon nitride or silicon oxide is formed on the data lines 171, the drain electrodes 175, the storage electrode capacitors 177 and the exposed portions of the semiconductor stripes 151.

An upper passivation layer 180q is formed on the lower passivation layer 180p. The upper passivation layer 180q is preferably made of inorganic insulator such as silicon nitride or silicon oxide, photosensitive organic material having a good flatness characteristic, or low dielectric insulating material such as a-Si:C:O and a-Si:O:F formed by plasma enhanced chemical vapor deposition (PECVD).

The upper and lower passivation layer 180p and 180q has a plurality of contact holes 182, 185 and 187 exposing the end portions 179 of the data lines 171, the drain electrodes 175, and the storage conductors 177, respectively. The upper and lower passivation layer 180p and 180q and the gate insulating layer 140 have a plurality of contact holes 181 exposing end portions 129 of the gate lines 121.

The lower passivation layer 180P may be omitted if necessary

A plurality of pixel electrodes 190 and a plurality of contact assistants 81 and 82, which are preferably made of IZO or ITO, are formed on the upper passivation layer 180q.

The pixel electrodes 190 are physically and electrically connected to the drain electrodes 175 through the contact holes 185 and to the storage capacitor conductors 177 through the contact holes 187 such that the pixel electrodes 190 receive the data voltages from the drain electrodes 175 and transmit the received data voltages to the storage capacitor conductors 177.

The pixel electrodes 190 supplied with the data voltages generate electric fields in cooperation with a common electrode (not shown) on another panel (not shown), which reorient liquid crystal molecules in a liquid crystal layer (not shown) disposed therebetween.

A pixel electrode 190 and a common electrode form a liquid crystal capacitor, which stores applied voltages after turn-off of the TFT. An additional capacitor called a "storage capacitor," which is connected in parallel to the liquid crystal capacitor, is provided for enhancing the voltage storing capacity. The storage capacitors are implemented by overlapping the pixel electrodes 190 with the gate lines 121 adjacent thereto (called "previous gate lines"). The capacitances of the storage capacitors, i.e., the storage capacitances are increased by providing the projections 127 at the gate lines 121 for increasing overlapping areas and by providing the storage capacitor conductors 177, which are connected to the pixel electrodes 190 and overlap the projections 127, under the pixel electrodes 190 for decreasing the distance between the terminals.

The pixel electrodes 190 overlap the gate lines 121 and the data lines 171 to increase aperture ratio but it is optional.

The contact assistants 81 and 82 are connected to the exposed end portions 129 of the gate lines 121 and the exposed end portions 179 of the data lines 171 through the contact holes 181 and 182, respectively. The contact assistants 81 and 82 are not requisites but preferred to protect the exposed portions 129 and 179 and to complement the adhesiveness of the exposed portion 129 and 179 and external devices.

The contact assistant 81 plays a part in connecting the end portions 129 of the gate lines 121 and a gate driving circuit when the gate driving circuit supplying the gate signals is integrated on the insulating substrate 110. In other embodiments, the contact assistant 81 may be omitted.

According to another embodiment of the present invention, the pixel electrodes 190 are made of transparent conductive polymer. For a reflective LCD, the pixel electrodes 190 are made of opaque reflective metal. In these cases, the contact assistants 81 and 82 may be made of material such as IZO or ITO different from the pixel electrodes 190.

The exposed surface of the upper passivation layer 180q by the pixel electrode 190 and the contact assistants 81 and 82 is lower than the surface of the upper passivation layer 180q under the pixel electrode 190 and the contact assistants 81 and 82.

A method of manufacturing the TFT array panel shown in FIGS. 1 and 2 according to an embodiment of the present invention will be now described in detail with reference to FIGS. 3 to 15 as well as FIGS. 1 and 2.

Figure 3:
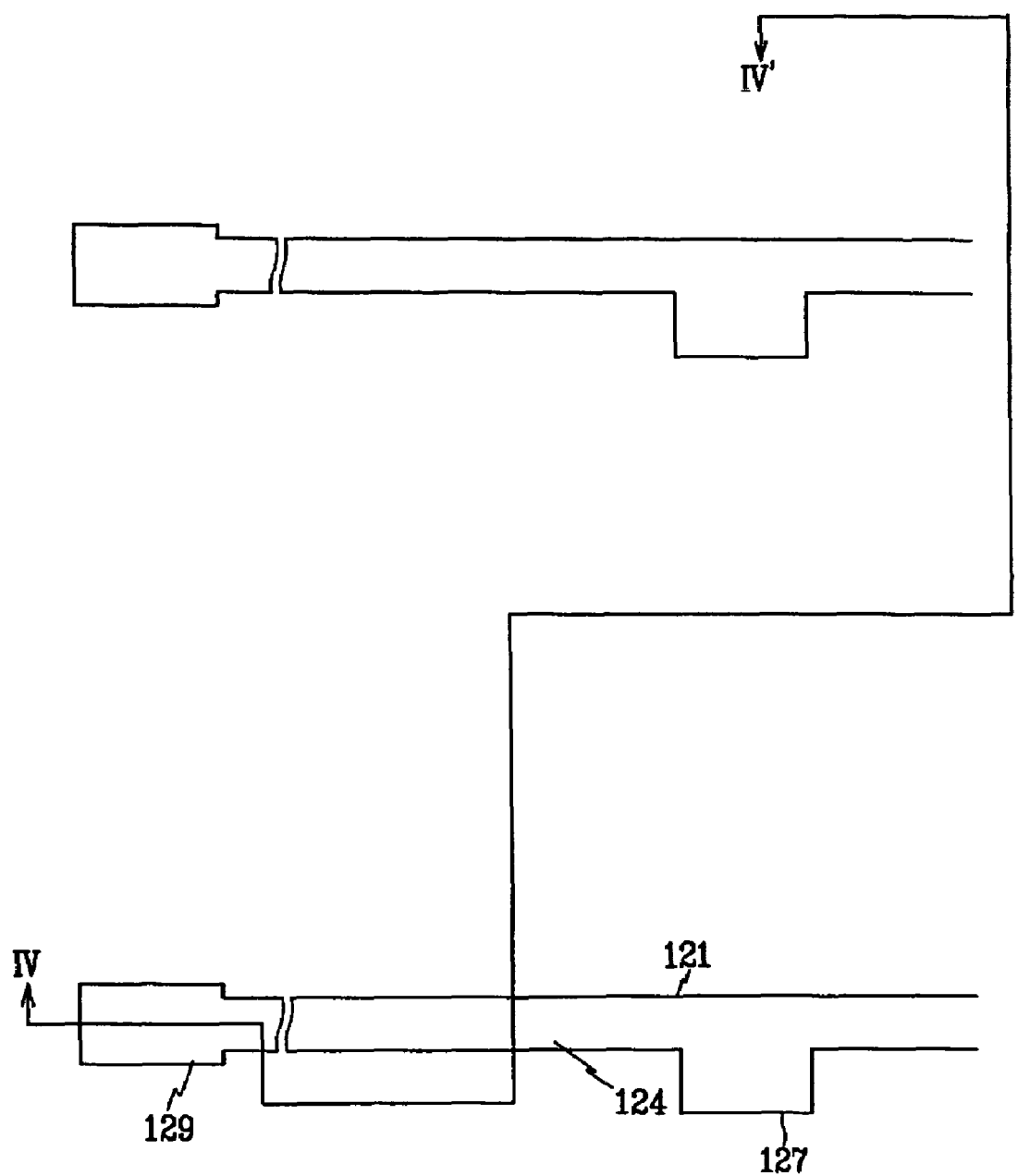
FIG. 3 is a layout view of a TFT array panel shown in FIGS. 1 and 2 in the first step of a manufacturing method thereof according to an embodiment of the present invention.
Figure 4:
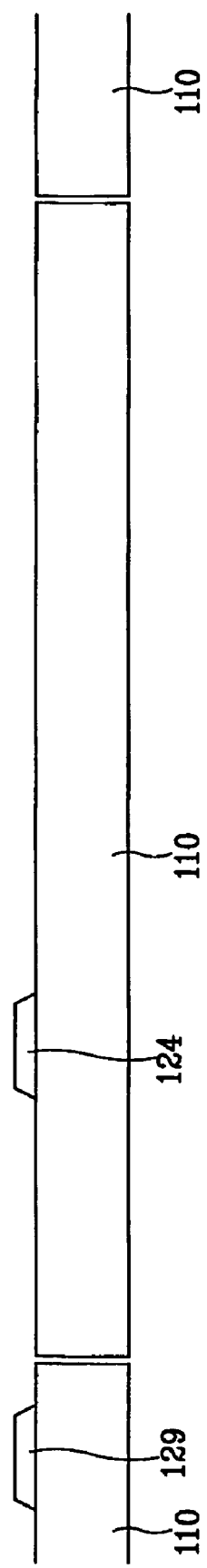
FIG. 4 is a sectional view of the TFT array panel shown in FIG. 3 taken along the line IV-IV'.
Figure 5:
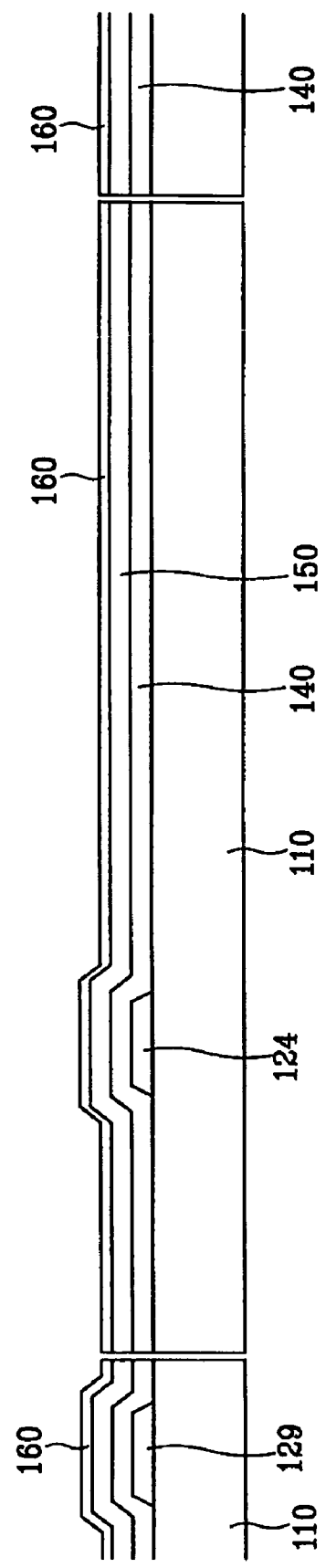
FIGS. 5 and 6 are sectional views of the TFT array panel shown in FIG. 3 taken along the lines IV-IV', and illustrate the step following the step shown in FIG. 4.
Figure 6:
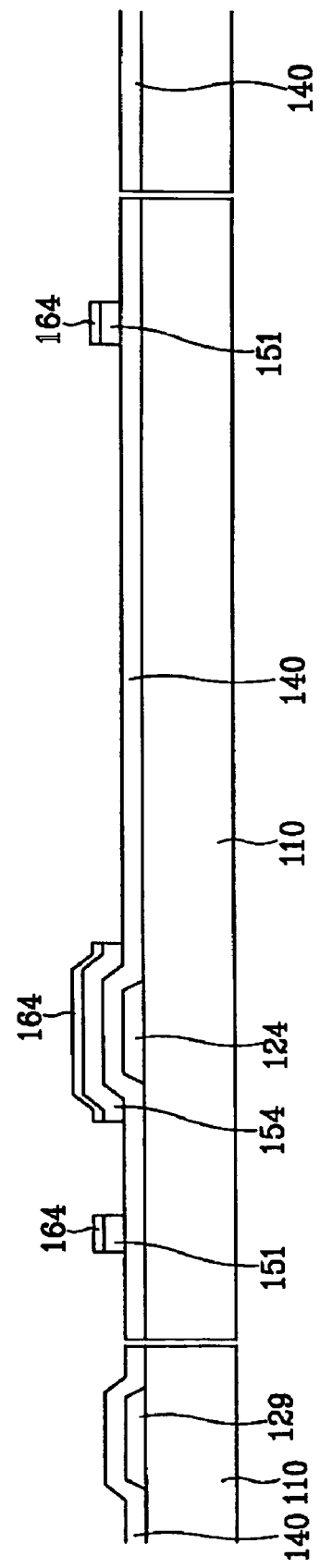
Figure 7:
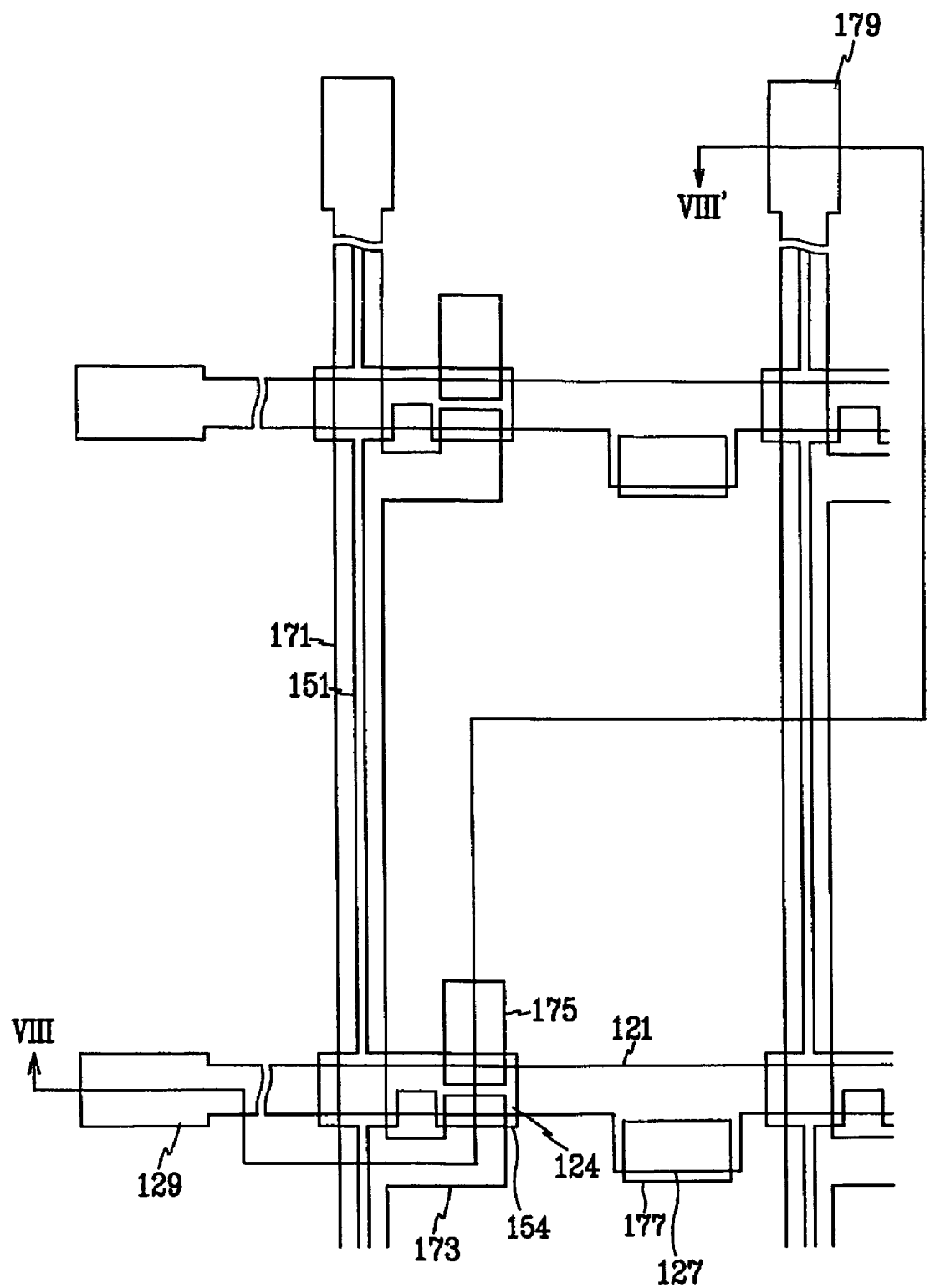
FIG. 7 is a layout view of the TFT array panel in the step following the step shown in FIG. 6.
Figure 8:
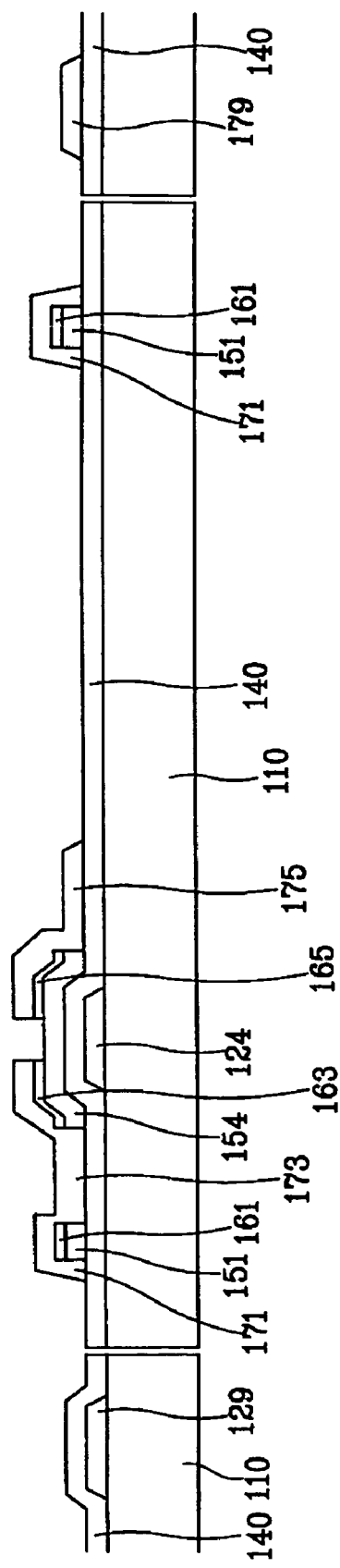
FIG. 8 is a sectional view of the TFT array panel shown in FIG. 7 taken along the lines VIII-VIII'.
Figure 9:
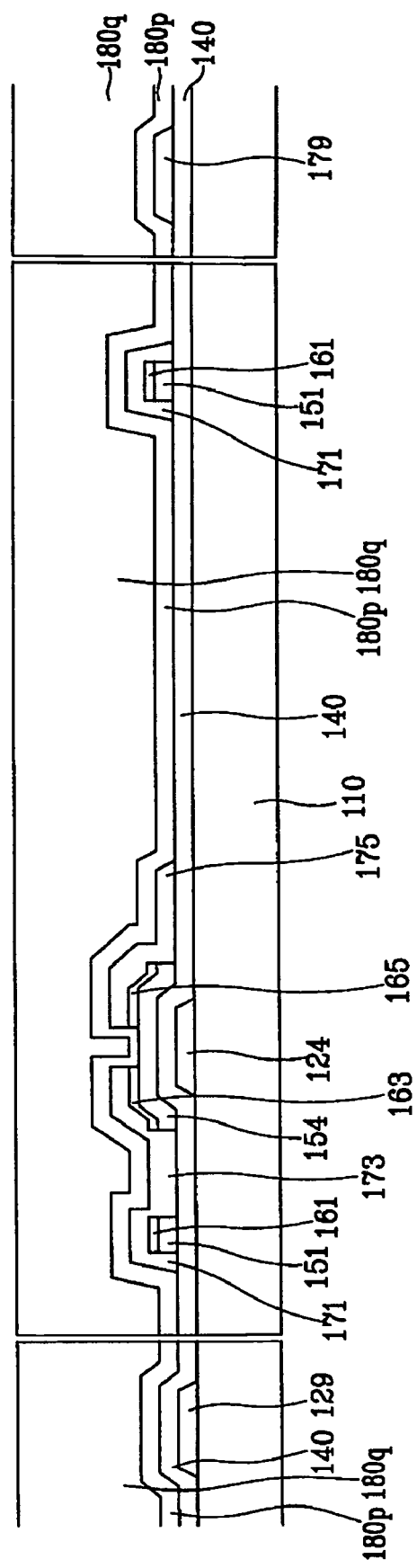
FIGS. 9 and 10 are sectional views of the TFT array panel shown in FIG. 7 taken along the lines VIII-VIII', and illustrate the step following the step shown in FIG. 8.
Figure 10:
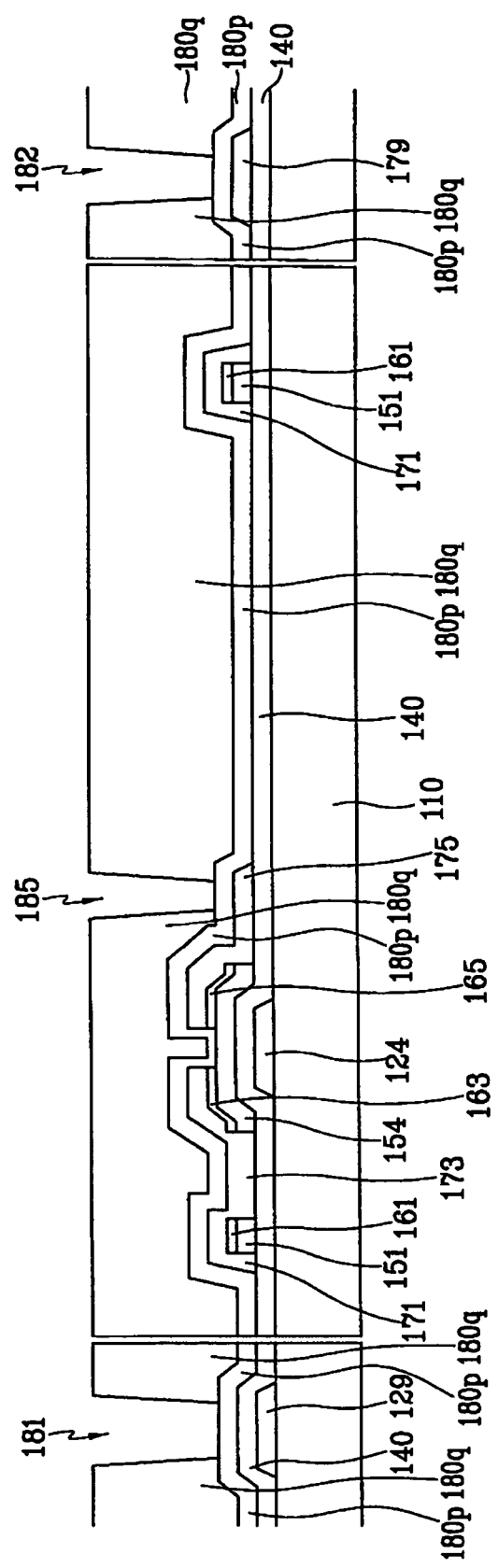
Figure 11:
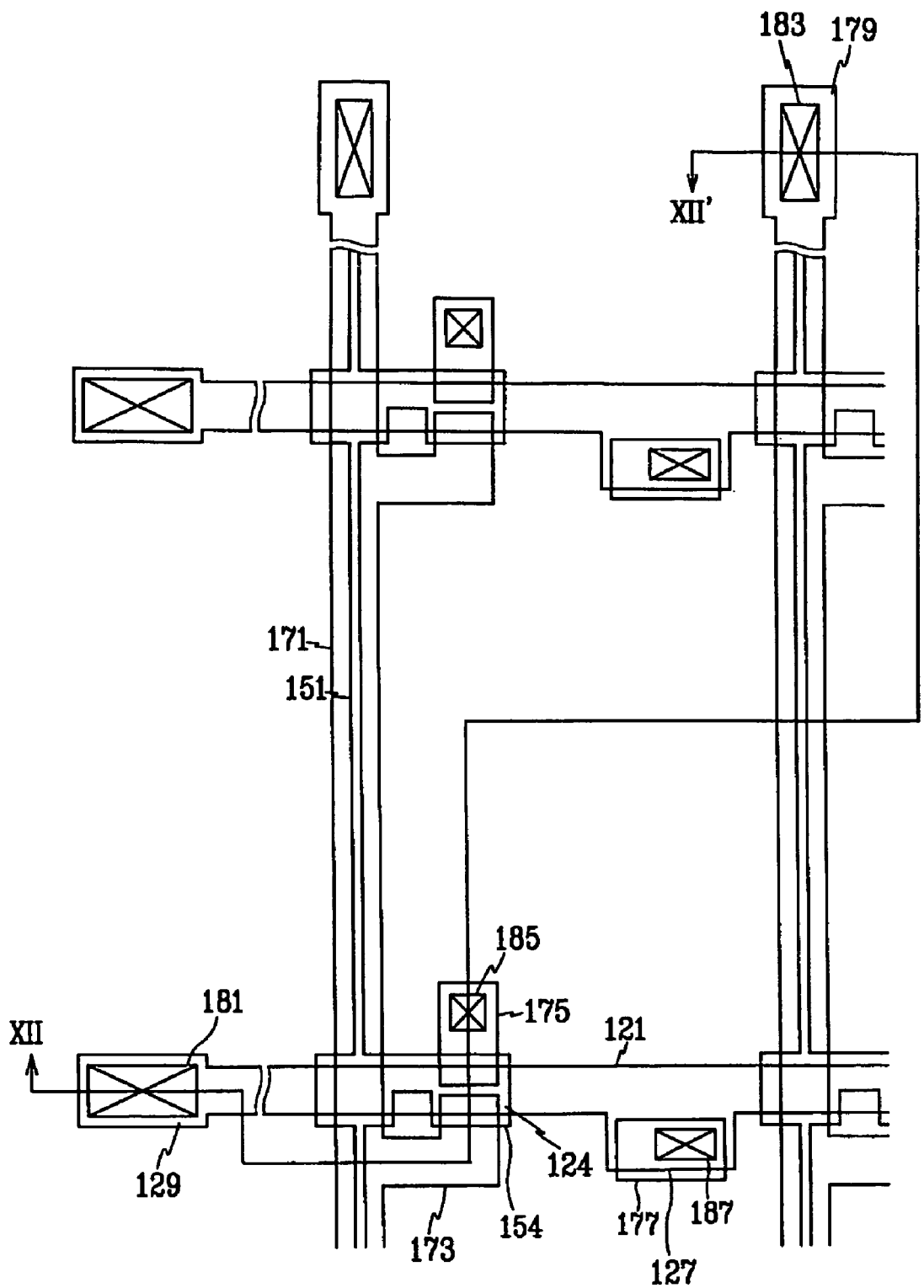
FIG. 11 is a layout view of the TFT array panel in the step following the step shown in FIG. 10.
Figure 12:
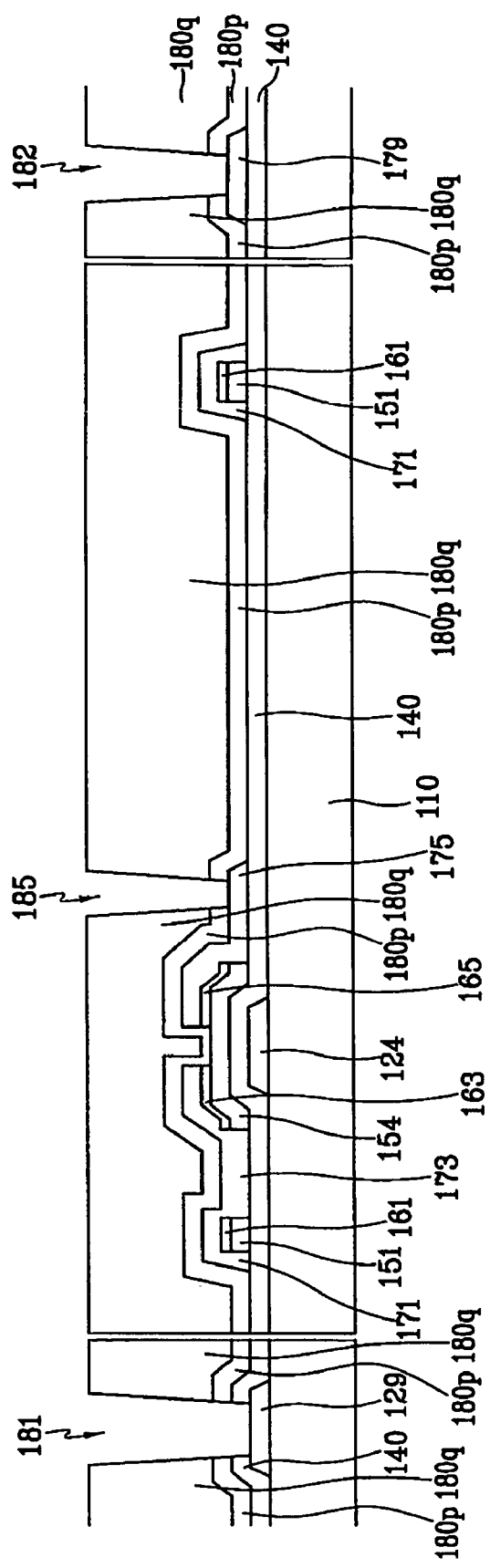
FIG. 12 is a sectional view of the TFT array panel shown in FIG. 11 taken along the lines XII-XII'.
Figure 13:
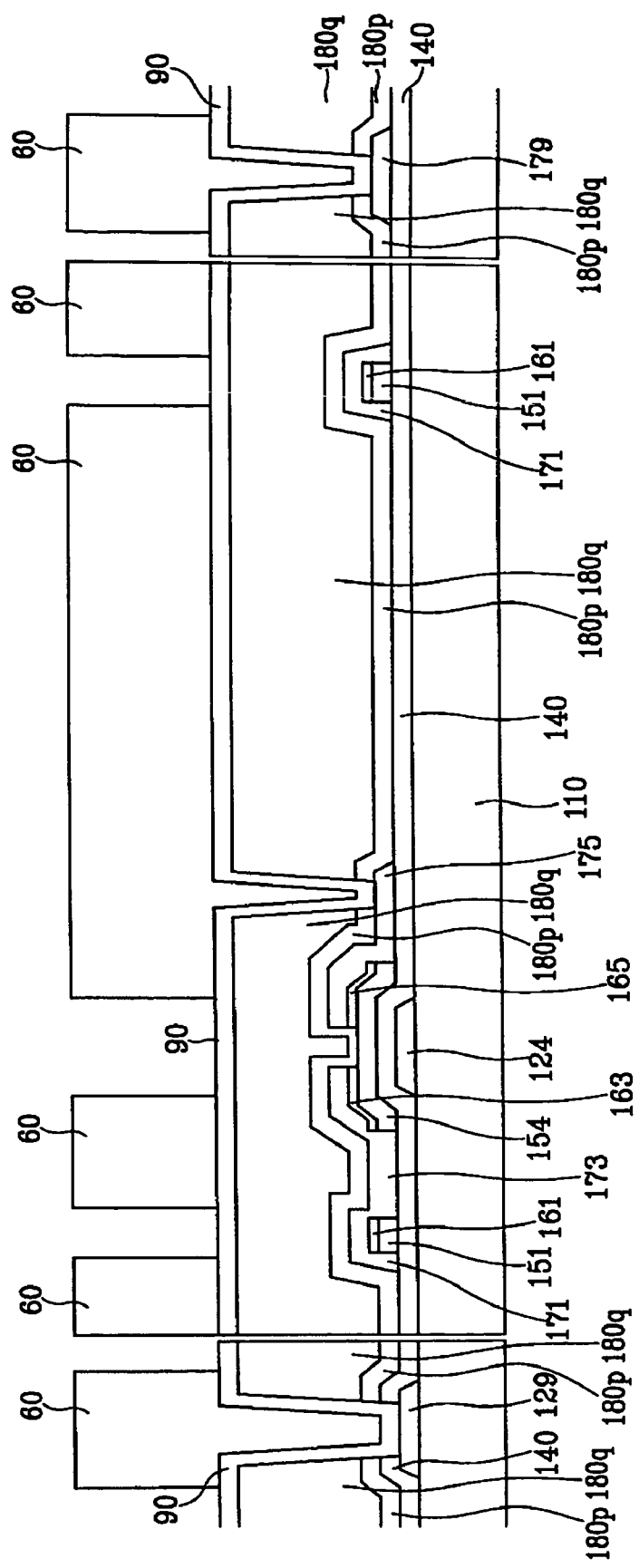
FIG. 13 is a sectional view of the TFT array panel in the step following the step shown in FIG. 12.
Figure 14:
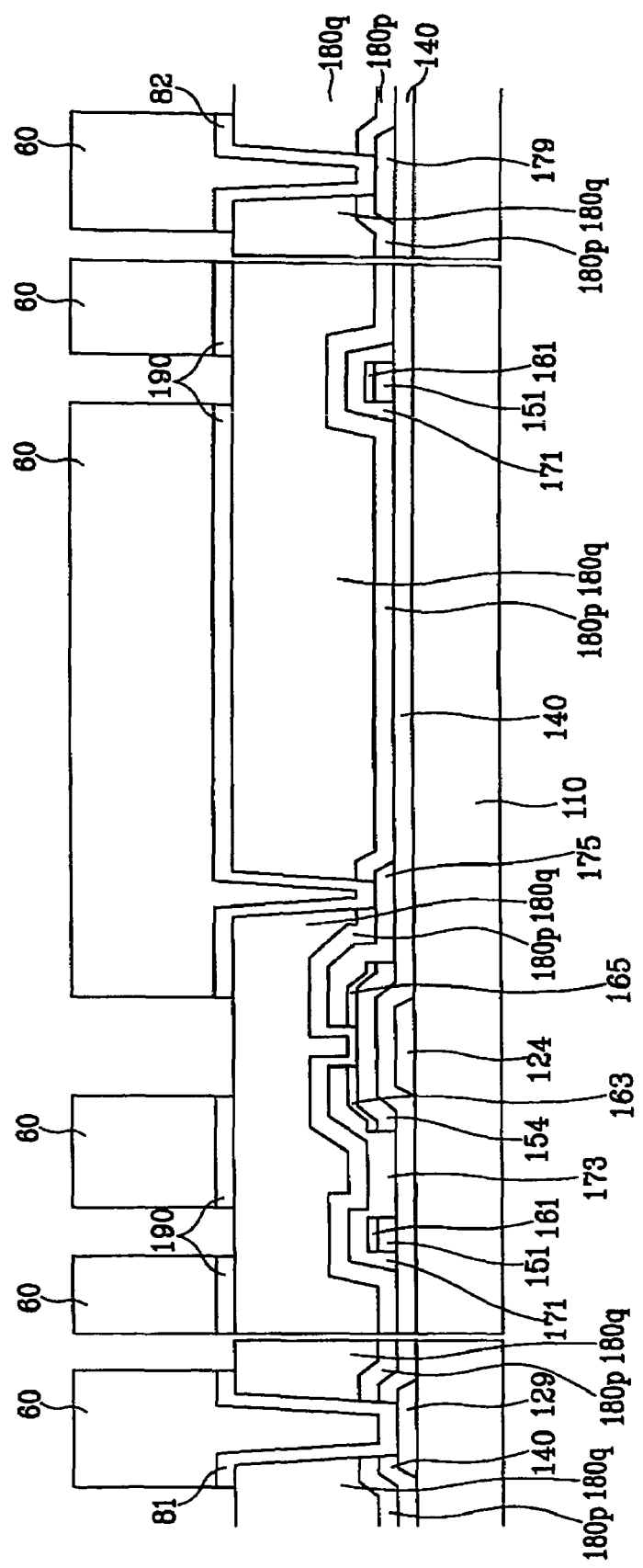
FIG. 14 is a sectional view of the TFT array panel in the step following the step shown in FIG. 13.
Figure 15:
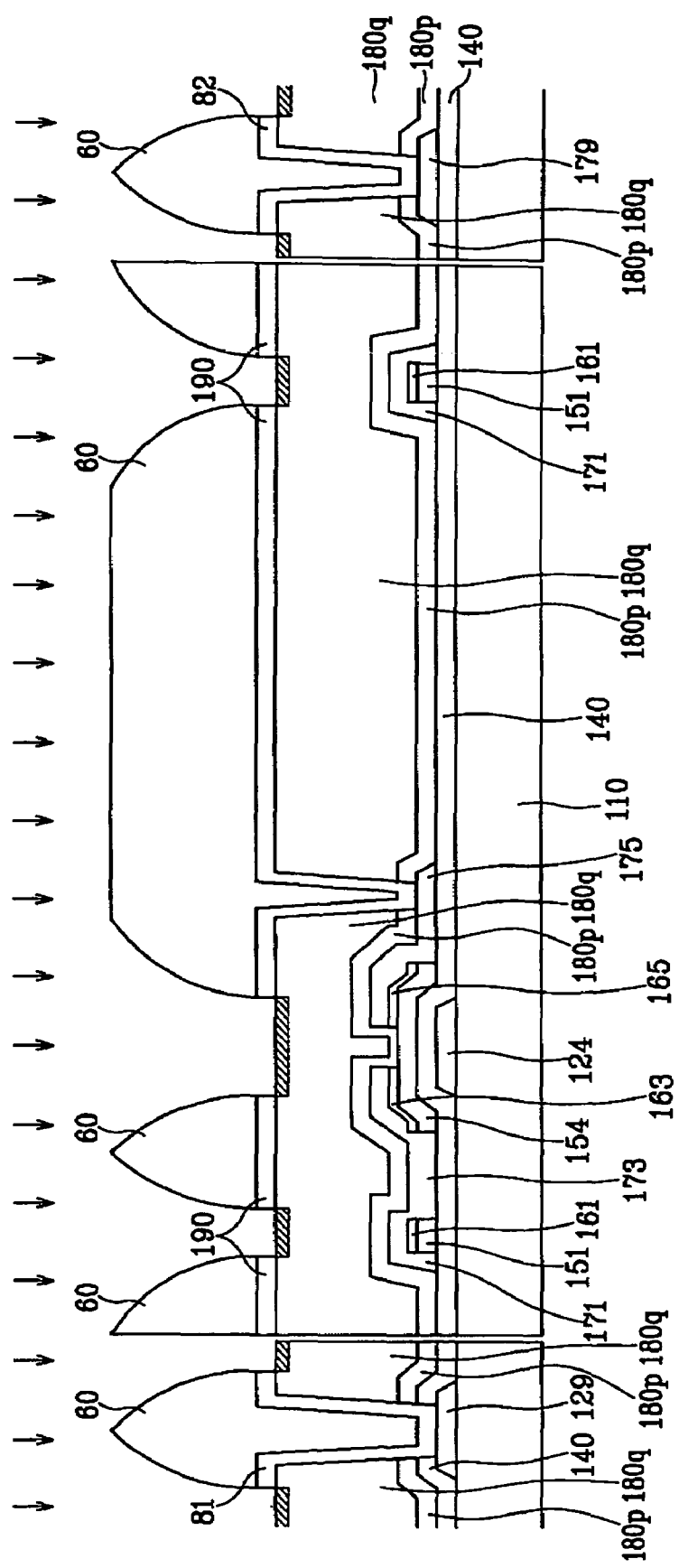
FIG. 15 is a sectional view of the TFT array panel in the step following the step shown in FIG. 14.

FIG. 3 is a layout view of a TFT array panel shown in FIGS. 1 and 2 in the first step of a manufacturing method thereof according to an embodiment of the present invention, FIG. 4 is a sectional view of the TFT array panel shown in FIG. 3 taken along the line IV-IV', FIGS. 5 and 6 are sectional views of the TFT array panel shown in FIG. 3 taken along the lines IV-IV', and illustrate the step following the step shown in FIG. 4, FIG. 7 is a layout view of the TFT array panel in the step following the step shown in FIG. 6, FIG. 8 is a sectional view of the TFT array panel shown in FIG. 7 taken along the lines VIII-VIII', FIGS. 9 and 10 are sectional views of the TFT array panel shown in FIG. 7 taken along the lines VIII-VIII', and illustrate the step following the step shown in FIG. 8, FIG. 11 is a layout view of the TFT array panel in the step following the step shown in FIG. 10, FIG. 12 is a sectional view of the TFT array panel shown in FIG. 11 taken along the lines XII-XII', FIG. 13 is a sectional view of the TFT array panel in the step following the step shown in FIG. 12, FIG. 14 is a sectional view of the TFT array panel in the step following the step shown in FIG. 13, and FIG. 15 is a sectional view of the TFT array panel in the step following the step shown in FIG. 14.

As shown in FIGS. 3 and 4, a metal film is sputtered and patterned by photo-etching with a photoresist pattern to form a plurality of gate lines 121 including a plurality of gate electrodes 124 and a plurality of projections 127.

Referring to FIGS. 5 and 6, after sequential deposition of a gate insulating layer 140, an intrinsic a-Si layer, and an extrinsic a-Si layer, the extrinsic a-Si layer and the intrinsic a-Si layer are photo-etched to form a plurality of extrinsic semiconductor stripes 164 and a plurality of intrinsic semiconductor stripes 151 including a plurality of projections 154 on the gate insulating layer 140. The gate insulating layer 140 is preferably made of silicon nitride with thickness of about 2,500 Å to about 5,500 Å, and the deposition temperature is preferably in a range between about 250° C. and about 500° C.

Referring to FIGS. 7 and 8, a conductive layer is sputtered and etched using a photoresist film (not shown) to form a plurality of data lines 171 including a plurality of source electrodes 173, a plurality of drain electrodes 175, and a plurality of storage capacitor conductors 177.

Before or after removing the photoresist film, portions of the extrinsic semiconductor stripes 164, which are not covered with the data lines 171, the drain electrodes 175, and the storage capacitor conductors 177, are removed by etch to complete a plurality of ohmic contact stripes 161 including a plurality of projections 163 and a plurality of ohmic contact islands 165 and to expose portions of the intrinsic semiconductor stripes 151. Oxygen plasma treatment may follow thereafter in order to stabilize the exposed surfaces of the semiconductor stripes 151.

Referring to FIG. 9, a lower passivation layer 180p preferably made of inorganic material such as silicon nitride or silicon oxide is formed by plasma enhanced chemical vapor deposition (PECVD), and an upper passivation layer 180q preferably made of photosensitive organic material is coated on the lower passivation layer 180p.

Referring to FIG. 10, the upper passivation layer 180q is exposed to light through a photo mask and developed to form a plurality of contact holes 181, 182, 185 and 187 and to expose the portion of the lower passivation layer 180p corresponding to the contact holes 181, 182, 185 and 187.

Referring to FIGS. 11 and 12, the exposed portion of the lower passivation layer 180p is dry etched along with the gate insulating layer 140 to complete a plurality of contact holes 181, 182, 185 and 187 exposing the end portions 129 of the gate lines 121, the end portions 179 of the data lines 171, the drain electrodes 175, and the storage capacitor conductors 177.

Next, a plasma treatment using Ar gas is performed on the portions of the end portions 129 and 179 of the gate and the data lines 121 and 171, the drain electrode 175 and the capacitor conductors 177 exposed through the contact holes 181, 182, 185 and 187, and the upper passivation layer 180$q$, and a conductive layer 90 preferably made of transparent material such as ITO, IZO and a-ITO (amorphous indium tin oxide) is deposited by sputtering. Then, a photoresist 60 is coated on the transparent conductive layer 90, and exposed and developed using a photo mask to expose the portions of the transparent conductive layer 90. At this time, the plasma treatment improves the adhesions between the upper passivation layer 180$q$ and the transparent conductive layer 90.

An example of sputtering target of IZO is IDIXO (indium x-metal oxide) produced by Idemitsu Co. of Japan. The sputtering target includes $In_2O_3$ and ZnO, and the ratio of Zn with respect to the sum of Zn and In is preferably in a range of about 15-20 atomic %. The preferred sputtering temperature for minimizing the contact resistance is equal to or lower than about 250° C.

Next, as shown in FIG. 14, the exposed portions of the transparent conductive layer 90 is etched using the photoresist 60 as an etch mask to form a plurality of pixel electrodes 190 and a plurality of contact assistants 81 and 82.

Referring to FIG. 15, the photoresist 60 and the upper passivation layer 180$q$ are removed by ashing. The ashing process is preformed until the predetermined thickness of the upper passivation layer 180$q$ is removed, then exposed surface of the upper passivation layer 180$q$ from the transparent conductive layer 90 is lower than the surface of the upper passivation layer 180$q$ under the transparent conductive layer 90. As shown in this embodiment, when the upper portion of the upper passivation layer 180$q$ is removed, the charges formed in the exposed surface of the upper passivation layer 180$q$ by the plasma treatment are removed. The hatching portion in FIG. 15 represents the portion of the upper passivation layer 180$q$ removed by ashing.

Finally, as shown in FIGS. 1 and 2, the photoresist 60 is removed on the second passivation layer 180$q$.

In this embodiment according to the present invention, the exposed surface of the upper passivation layer 180$q$ is removed to eliminate the charges formed by the plasma treatment after etching the transparent conductive layer 90 for pixel electrodes 190 and a plurality of contact assistants 81 and 82, thereby preventing the deterioration of the quality of the LCD due to the charges.

A TFT array panel for an LCD according to another embodiment of the present invention will be described in detail with reference to FIGS. 16 and 17.

Figure 16:
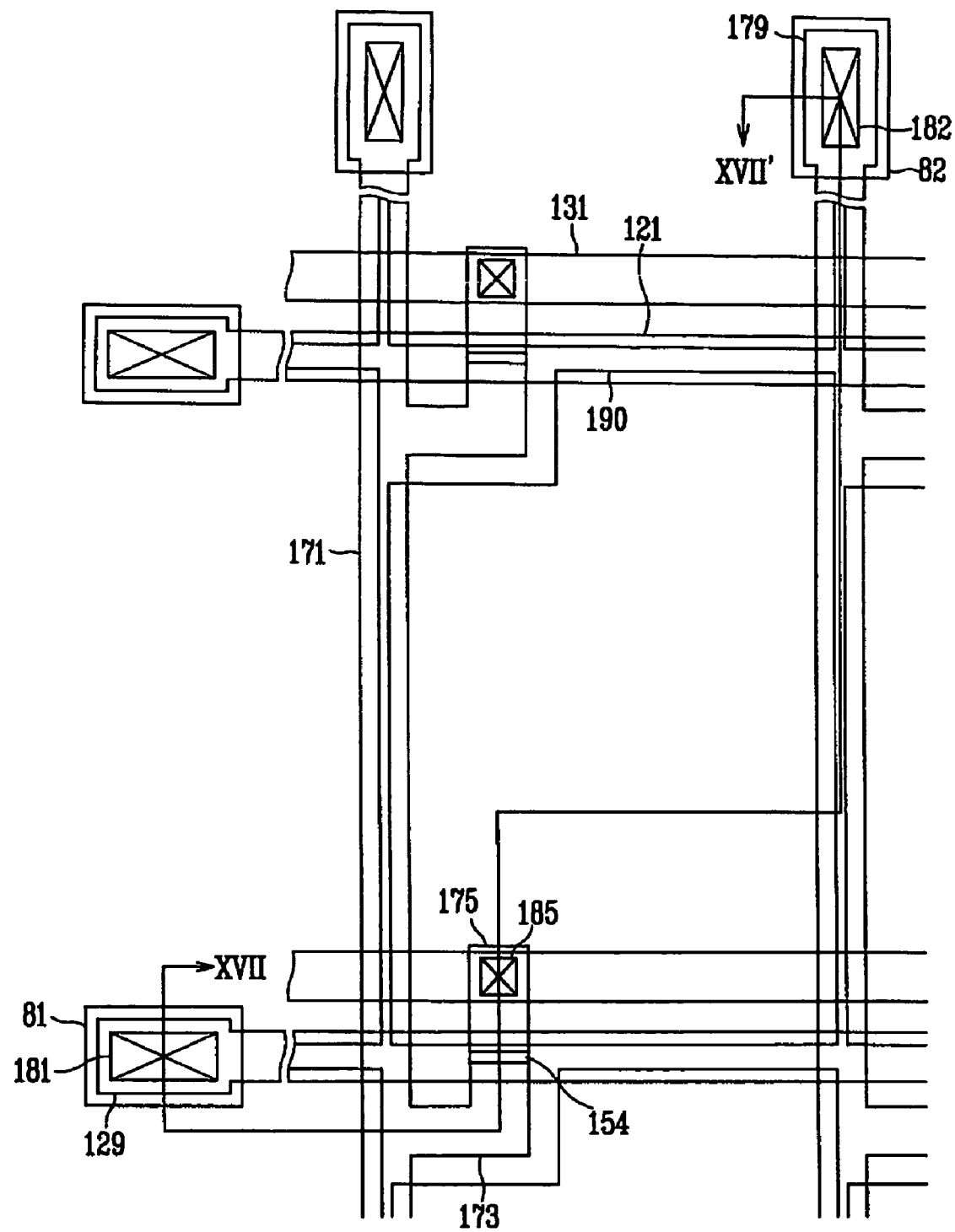
FIG. 16 is a layout view of a TFT array panel for an LCD according to another embodiment of the present invention.
Figure 17:
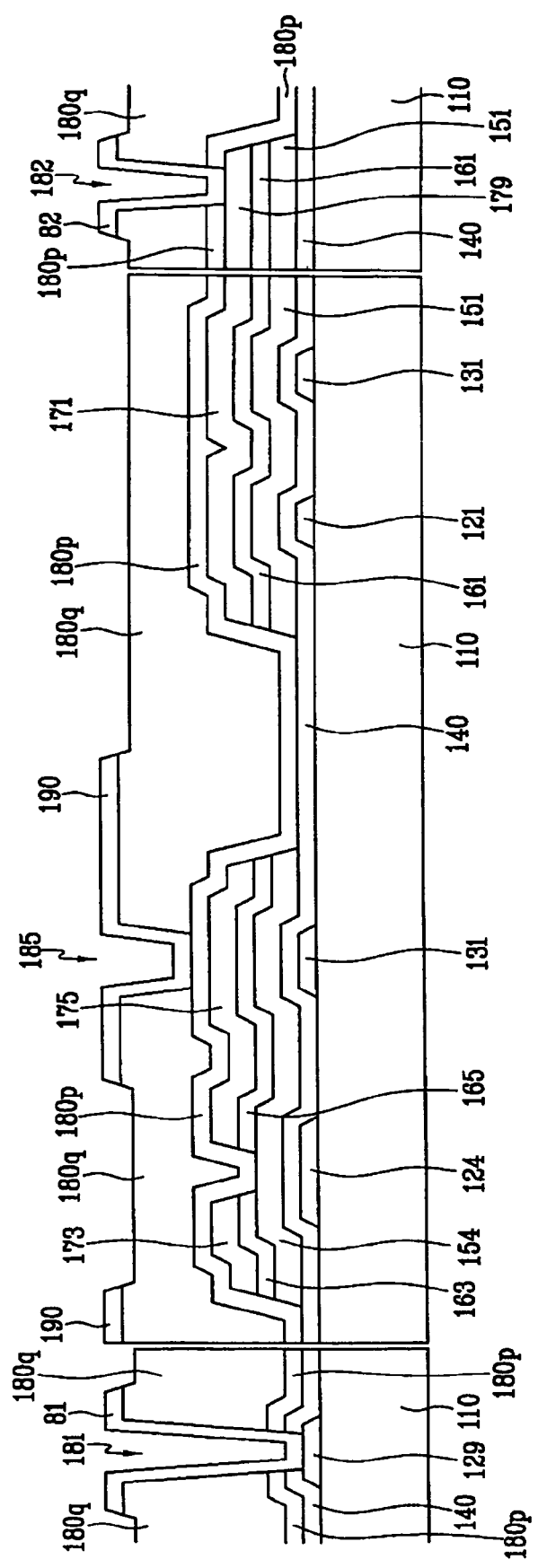
FIG. 17 is sectional view of the TFT array panel shown in FIG. 16 taken along the line XVII-XVII'.

FIG. 16 is a layout view of a TFT array panel of an LCD according to another embodiment of the present invention, and FIG. 17 is a sectional view of the TFT array panel shown in FIG. 16 taken along the line XVII-XVII'.

A plurality of gate lines 121 and a plurality of storage electrode lines 131 are formed on an insulating substrate 110 such as transparent glass.

The gate lines 121 extend substantially in a transverse direction and are separated from each other and transmit gate signals. Each gate line 121 includes a plurality of projections forming a plurality of gate electrodes 124 and an end portion 129 having a large area for contact with another layer or an external driving circuit. The gate lines 121 may extend to be connected to a driving circuit that may be integrated on the insulating substrate 110.

Each storage electrode line 131 which are separated from the gate lines 121 extends substantially in the transverse direction and is disposed between adjacent two of the gate lines 121. The storage electrode lines 131 are supplied with a predetermined voltage such as the common voltage of other panel (not shown).

The gate lines 121 and the storage electrode lines 131 are preferably made of Al containing metal such as Al and Al alloy, Ag containing metal such as Ag and Ag alloy, Cu containing metal such as Cu and Cu alloy, Mo containing metal such as Mo and Mo alloy, Cr, Ti or Ta. The gate lines 121 may have a multi-layered structure including two films having different physical characteristics. One of the two films is preferably made of low resistivity metal including Al containing metal for reducing signal delay or voltage drop in the gate lines 121. The other film is preferably made of material such as Cr, Mo and Mo alloy, Ta or Ti, which has good physical, chemical, and electrical contact characteristics with other materials such as indium tin oxide (ITO) or indium zinc oxide (IZO). Good examples of the combination of the two films are a lower Cr film and an upper Al (Al—Nd alloy) film and a lower Al (Al alloy) film and an upper Mo film.

In addition, the lateral sides of the gate line 121 and the storage line 131 are tapered, and the inclination angle of the lateral sides with respect to a surface of the substrate 110 ranges about 30-80 degrees.

A gate insulating layer 140 preferably made of silicon nitride (SiNx) is formed on the gate lines 121.

A plurality of semiconductor stripes 151 and a plurality of semiconductor islands 157 preferably made of hydrogenated amorphous silicon (abbreviated to "a-Si") are formed on the gate insulating layer 140. Each semiconductor stripe 151 extends substantially in a longitudinal direction and has a plurality of projections 154 branched out toward the gate electrodes 124 and a plurality of protrusions 152 disposed on the storage electrode lines 131.

A plurality of ohmic contact stripes and islands 161 and 165 preferably made of silicide or n+ hydrogenated a-Si heavily doped with n type impurity are formed on the semiconductor stripes 151. Each ohmic contact stripe 161 has a plurality of projections 163, and the projections 163 and the ohmic contact islands 165 are located in pairs on the projections 154 of the semiconductor stripes 151.

The lateral sides of the semiconductor stripes 151 and the ohmic contacts 161 and 165 are tapered, and the inclination angles thereof are preferably in a range between about 30-80 degrees.

A plurality of data lines 171 and a plurality of drain electrodes 175 are formed on the ohmic contacts 161 and 165 and the gate insulating layer 140.

The data lines 171 for transmitting data voltages extend substantially in the longitudinal direction and intersect the gate lines 121 and the storage electrode lines 131. Each data line 171 has an end portion 179 having a large area for contact with another layer or an external device, and a plurality of branches of each data line 171, which project toward the drain electrodes 175, forms a plurality of source electrodes 173. Each set of a gate electrode 124, a source electrode 173, and a drain electrode 175 along with a projection 154 of a semiconductor stripe 151 form a TFT having a channel formed in the semiconductor projection 154 disposed between the source electrode 173 and the drain electrode 175.

The data lines 171 and the drain electrode 175 are preferably made of refractory metal including Cr, Mo, Ti, Ta or alloys thereof. They may have a multi-layered structure preferably including a low resistivity film and a good contact film.

At this time, the semiconductor stripes 151 of the TFT array panel according to this embodiment have almost the same planar shapes as the data lines 171 and the drain electrodes 175 as well as the underlying ohmic contacts 161 and 165. However, the projections 154 of the semiconductor stripes 151 include some exposed portions, which are not covered with the data lines 171 and the drain electrodes 175, such as portions located between the source electrodes 173 and the drain electrodes 175.

Like the gate lines. 121, the data lines 171 and the drain electrodes 175 have tapered lateral sides, and the inclination angles thereof range about 30-80 degrees.

A lower passivation layer 180p preferably made of silicon nitride or silicon oxide is formed on the data lines 171, the drain electrodes 175, and the exposed portions of the semiconductor stripes 151, and an upper passivation layer 180q preferably made of photosensitive organic material having a good flatness characteristic, is formed thereon.

The upper and lower passivation layer 180p and 180q has a plurality of contact holes 185 and 182 exposing the drain electrodes 175, and end portions 179 of the data lines 171, respectively. The passivation layer 180 and the gate insulating layer 140 have a plurality of contact holes 181 exposing end portions 129 of the gate lines 121.

A plurality of pixel electrodes 190 and a plurality of contact assistants 81 and 82, which are preferably made of IZO or ITO, are formed on the upper passivation layer 180q.

The pixel electrodes 190 are physically and electrically connected to the drain electrodes 175 through the contact holes 185 such that the pixel electrodes 190 receive the data voltages from the drain electrodes 175.

The pixel electrodes 190 supplied with the data voltages generate electric fields in cooperation with the common electrode on the other panel (not shown), which reorient liquid crystal molecules in the liquid crystal layer disposed therebetween.

The pixel electrodes 190 overlap the gate lines 121 and the data lines 171 to increase aperture ratio but it is optional.

The contact assistants 81 and 82 are connected to the exposed end portions 129 of the gate lines 121 and the exposed end portions 179 of the data lines 171 through the contact holes 181 and 182, respectively. The contact assistants 81 and 82 are not requisites but preferred to protect the exposed portions 129 and 179 and to complement the adhesiveness of the exposed portion 129 and 179 and external devices.

The contact assistant 81 plays a part in connecting the end portions 129 of the gate lines 121 and a gate driving circuit when the gate driving circuit supplying the gate signals is integrated on the insulating substrate 110. In other embodiments, the contact assistant 81 may be omitted.

According to another embodiment of the present invention, the pixel electrodes 190 are made of transparent conductive polymer. For a reflective LCD, the pixel electrodes 190 are made of opaque reflective metal. In these cases, the contact assistants 81 and 82 may be made of material such as IZO or ITO different from the pixel electrodes 190.

Now, a method of manufacturing the TFT array panel shown in FIGS. 16 and 17 according to an embodiment of the present invention will be described in detail with reference to FIGS. 18-29 as well as FIGS. 16 and 17.

Figure 18:
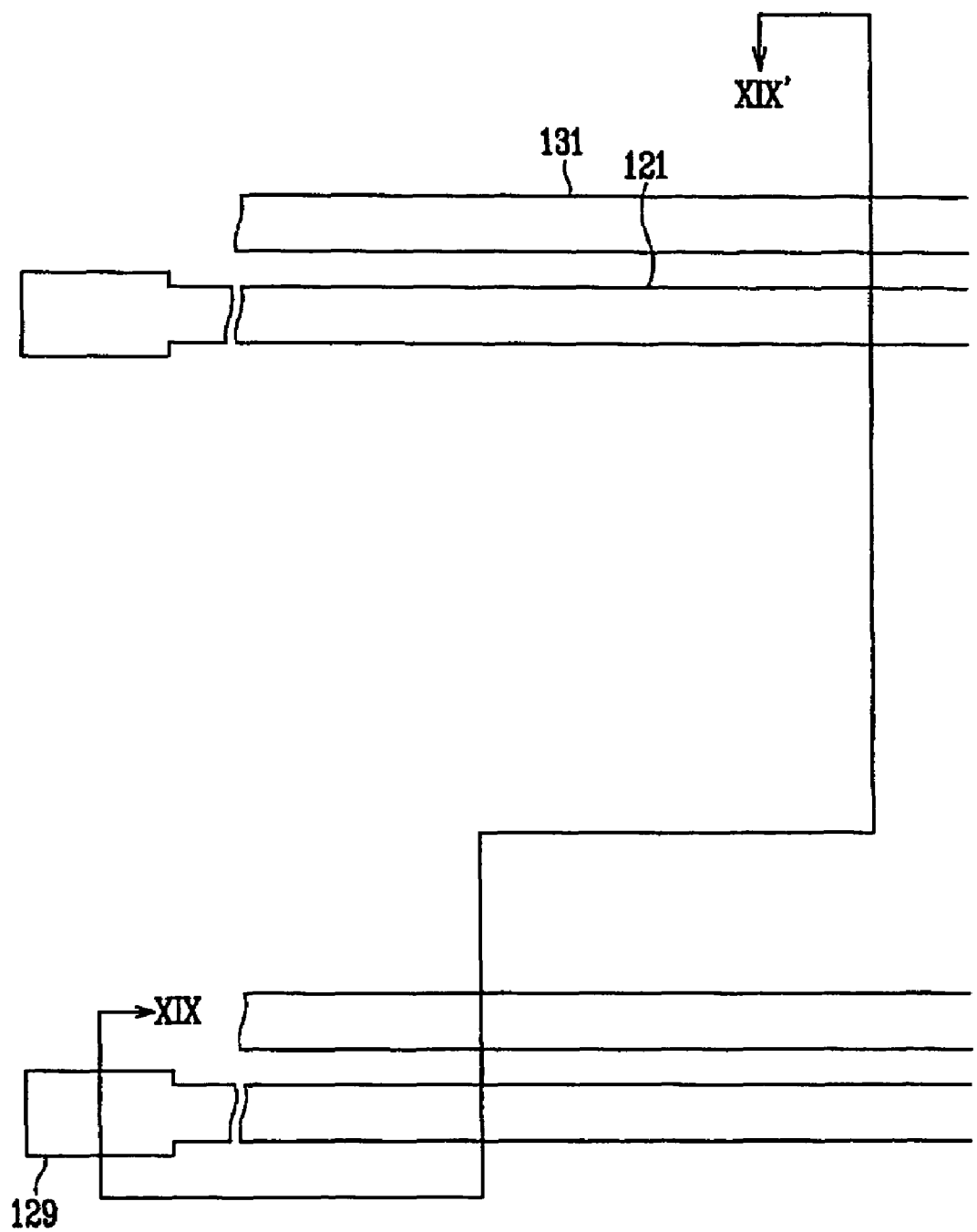
FIG. 18 is a layout view of a TFT array panel shown in FIGS. 16 and 17 in the first step of a manufacturing method thereof according to another embodiment of the present invention.
Figure 19:
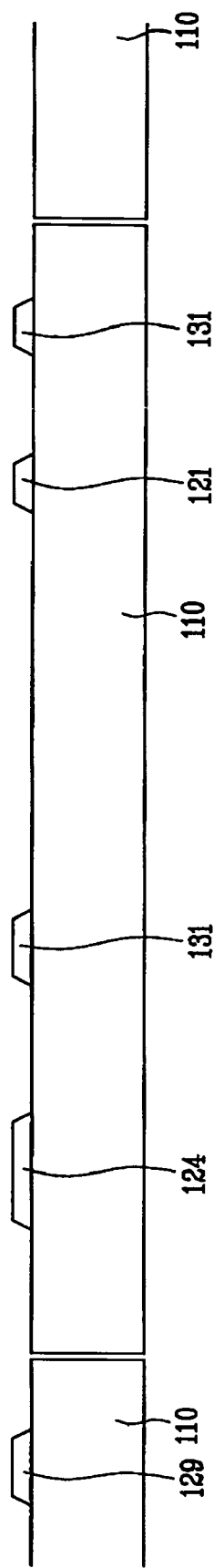
FIG. 19 is a sectional view of the TFT array panel shown in FIG. 18 taken along the line XIX-XIX.
Figure 20:
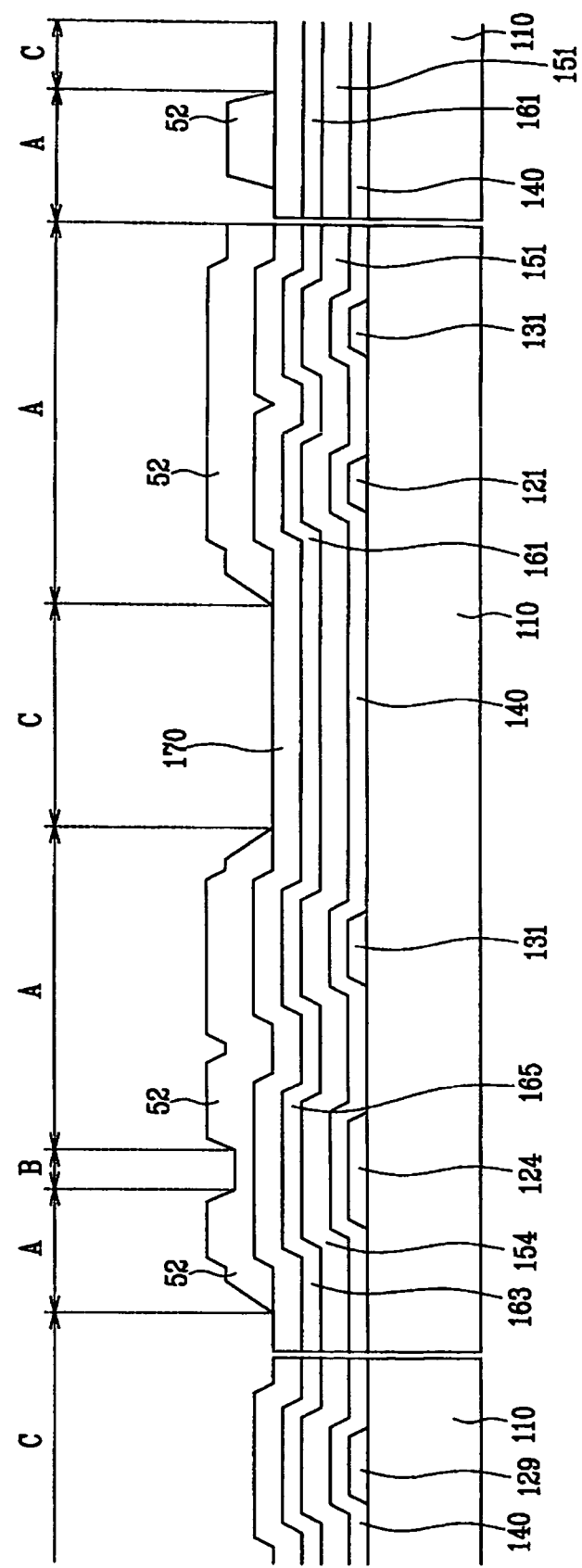
FIGS. 20 and 21 are sectional views of the TFT array panel shown in FIG. 18 taken along the line XIX-XIX, and illustrate the step following the step shown in FIG. 19.
Figure 21:
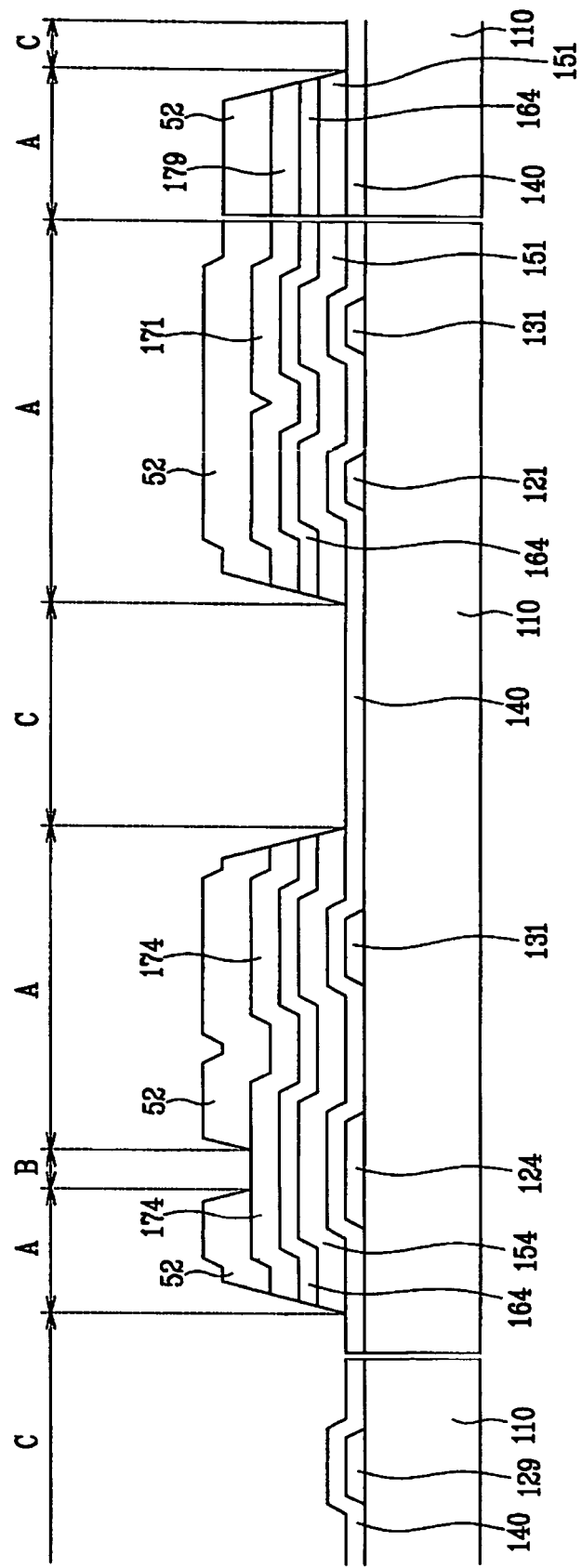
Figure 22:
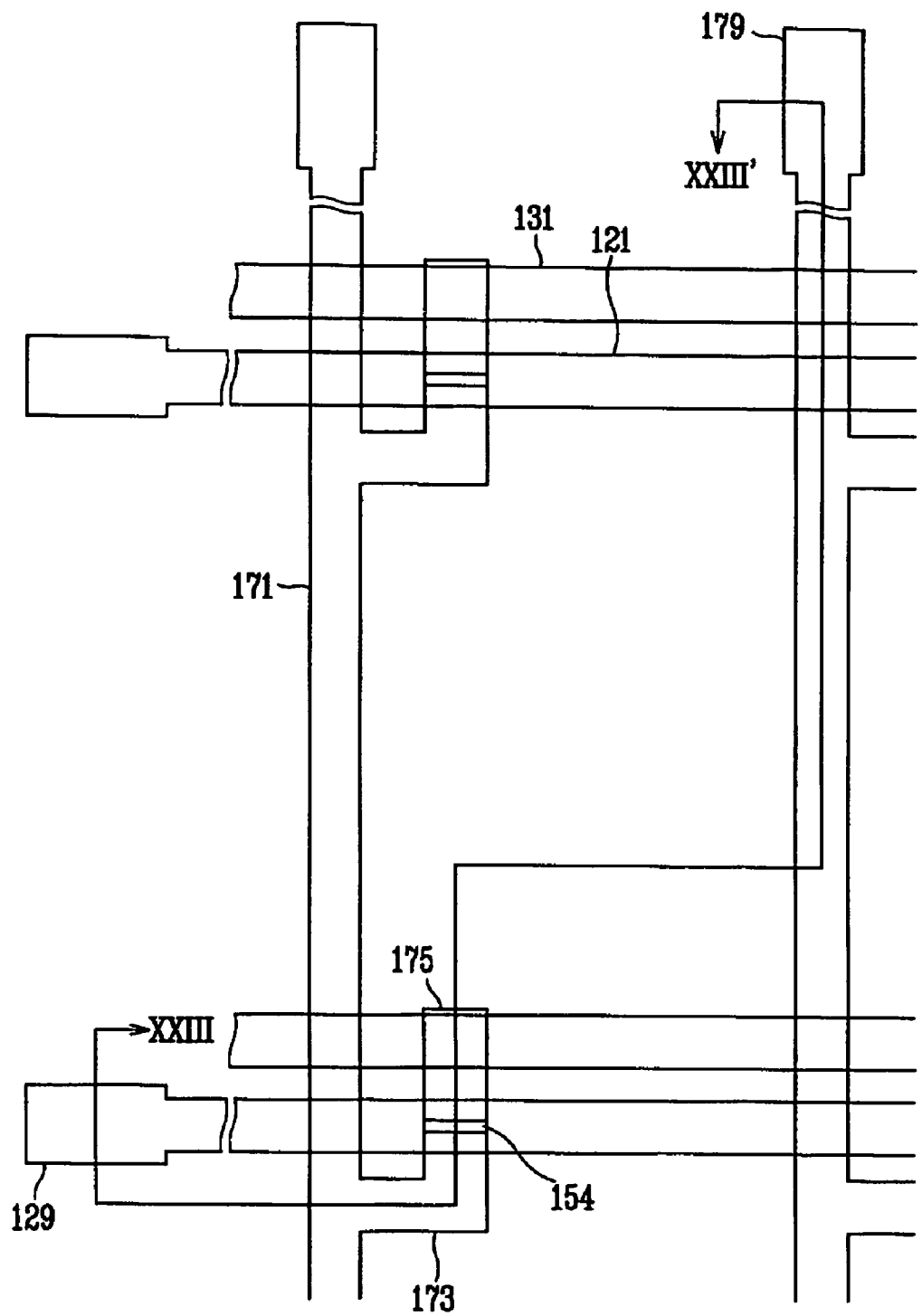
FIG. 22 is a layout view of the TFT array panel in the step following the step shown in FIG. 21.
Figure 23:
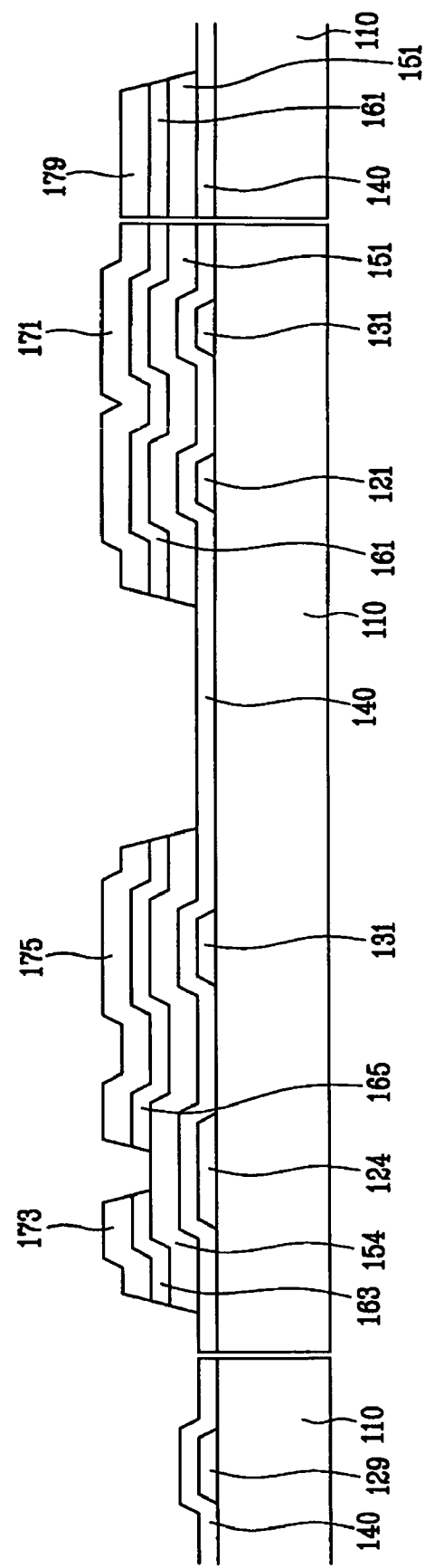
FIG. 23 is a sectional view of the TFT array panel shown in FIG. 22 taken along the line XXIII-XXIII.
Figure 24:
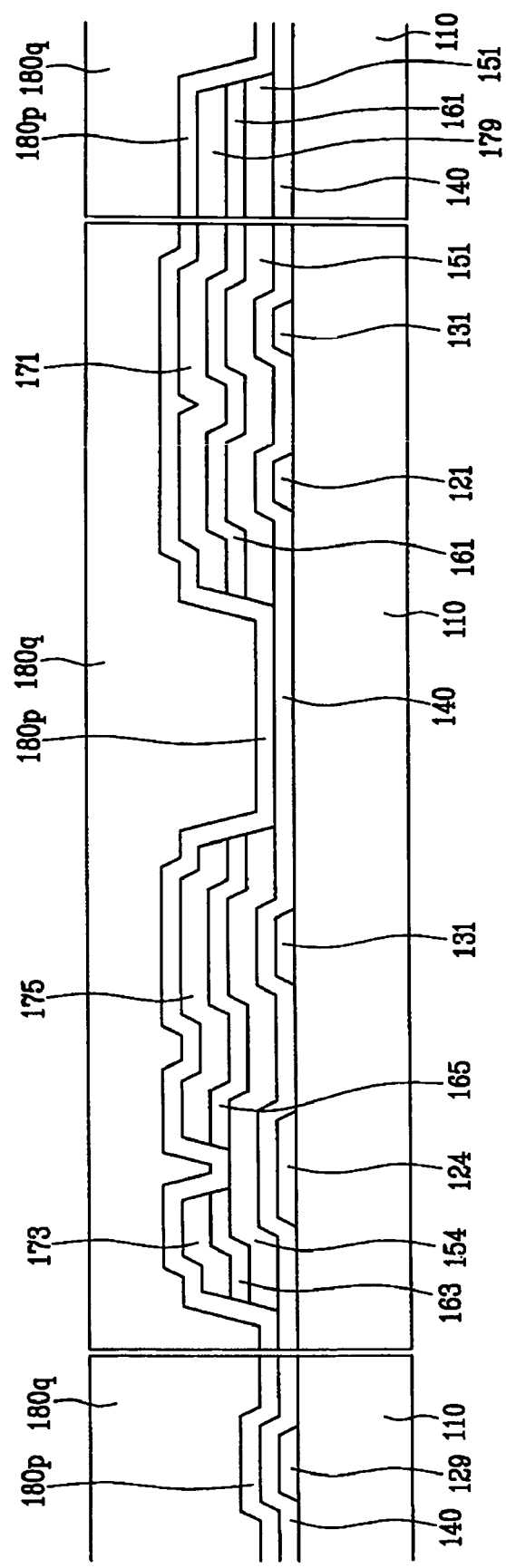
FIG. 24 is a sectional view of the TFT array panel shown in FIG. 22 taken along the line XXIII-XXIII, and illustrates the step following the step shown in FIG. 23.
Figure 25:
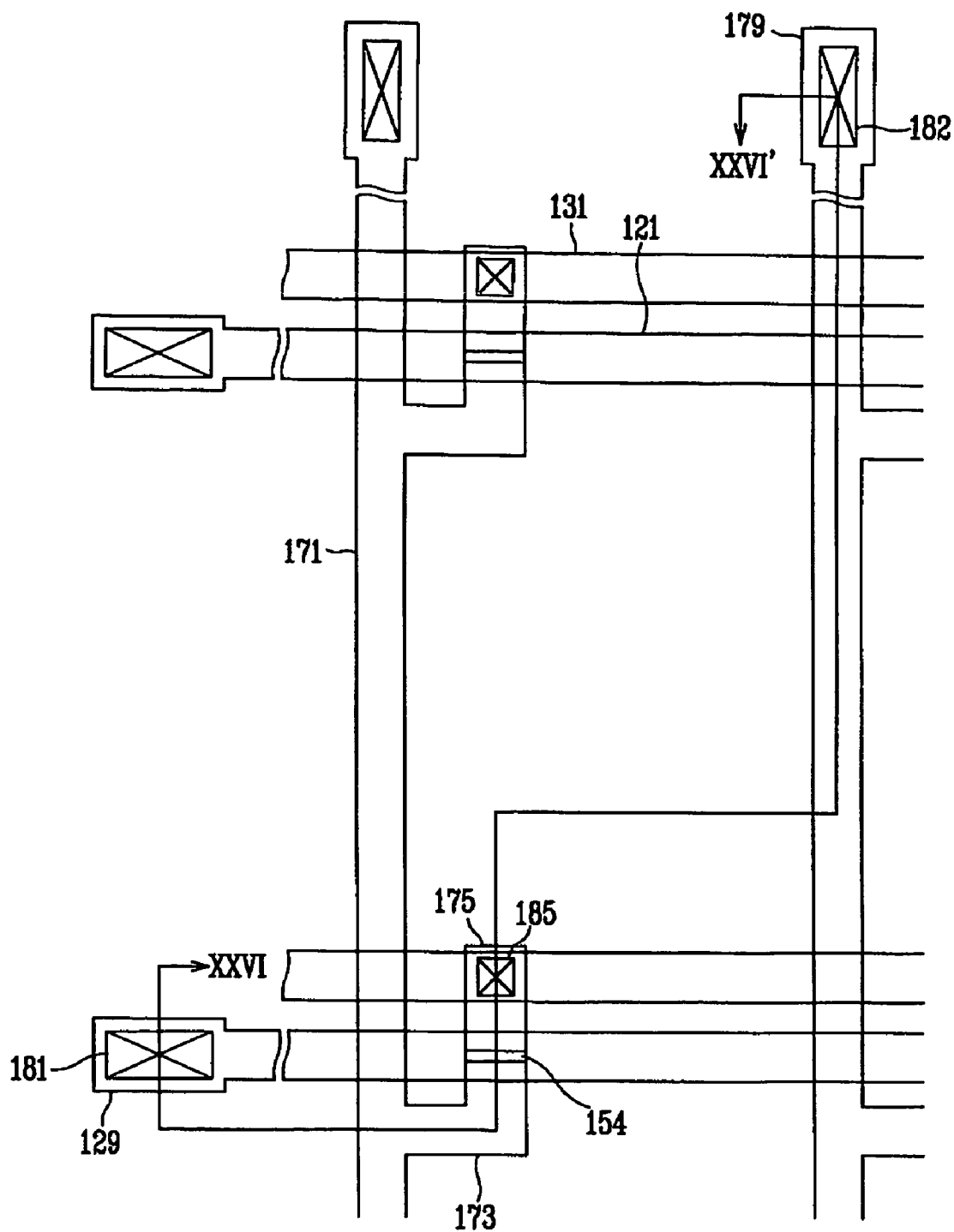
FIG. 25 is a layout view of the TFT array panel in the step following the step shown in FIG. 24.
Figure 26:
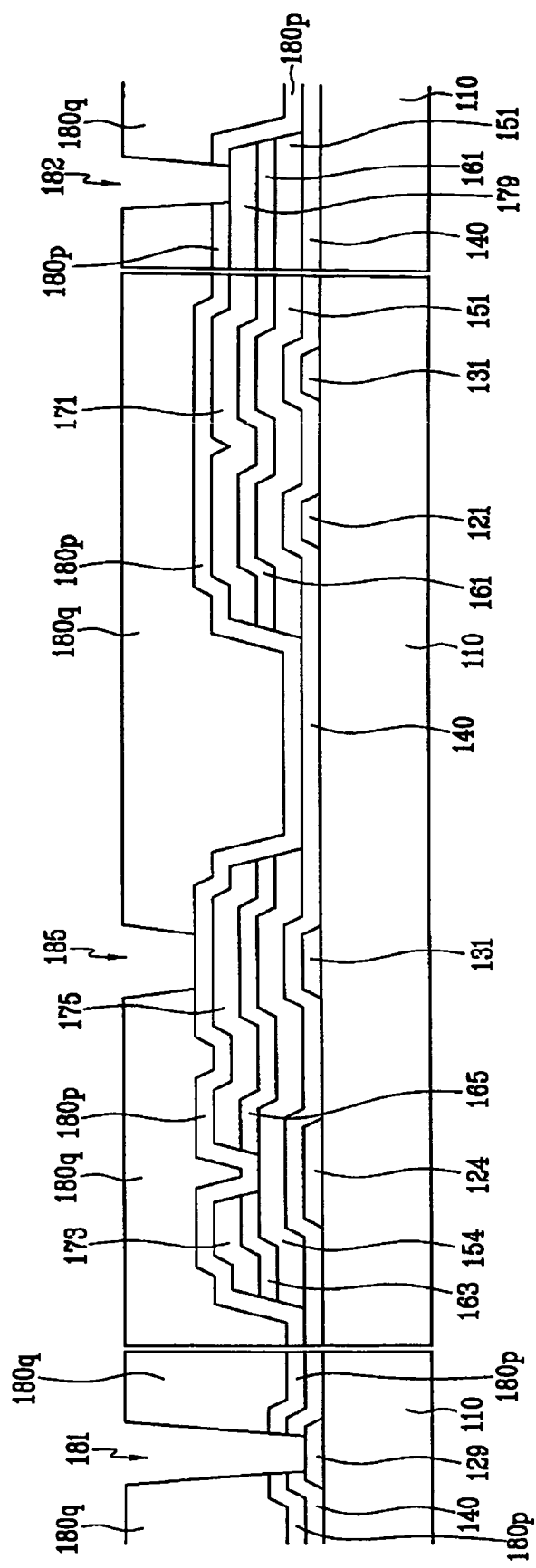
FIG. 26 is a sectional view of the TFT array panel shown in FIG. 25 taken along the line XXVI-XXVI.
Figure 27:
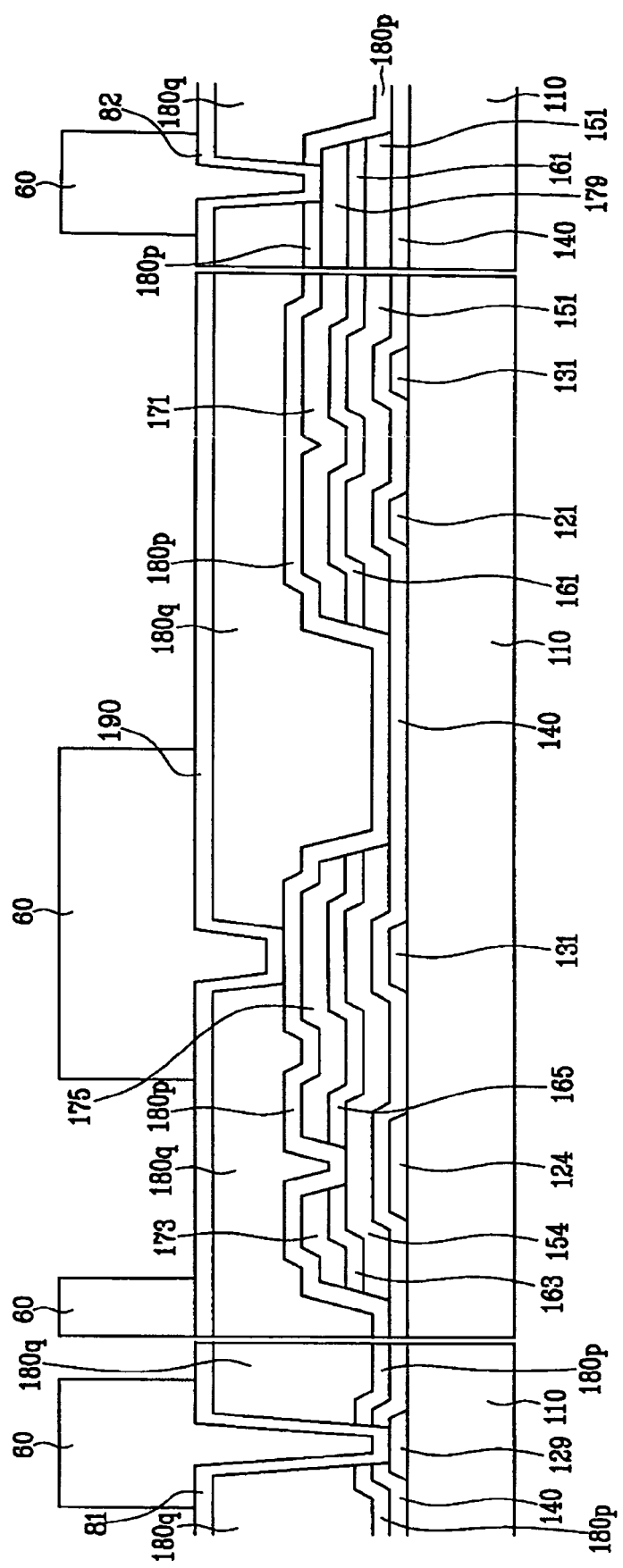
FIG. 27 is a sectional view of the TFT array panel in the step following the step shown in FIG. 26.
Figure 28:
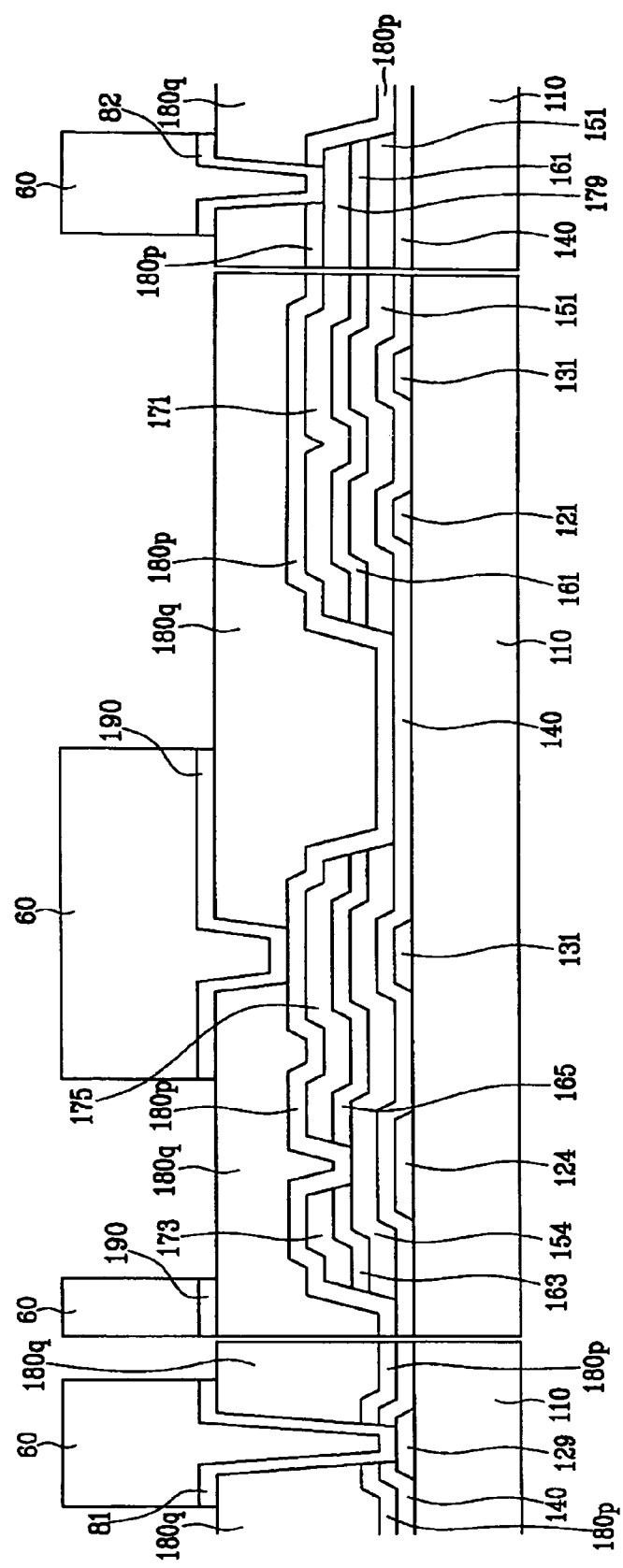
FIG. 28 is a sectional view of the TFT array panel in the step following the step shown in FIG. 27.
Figure 29:
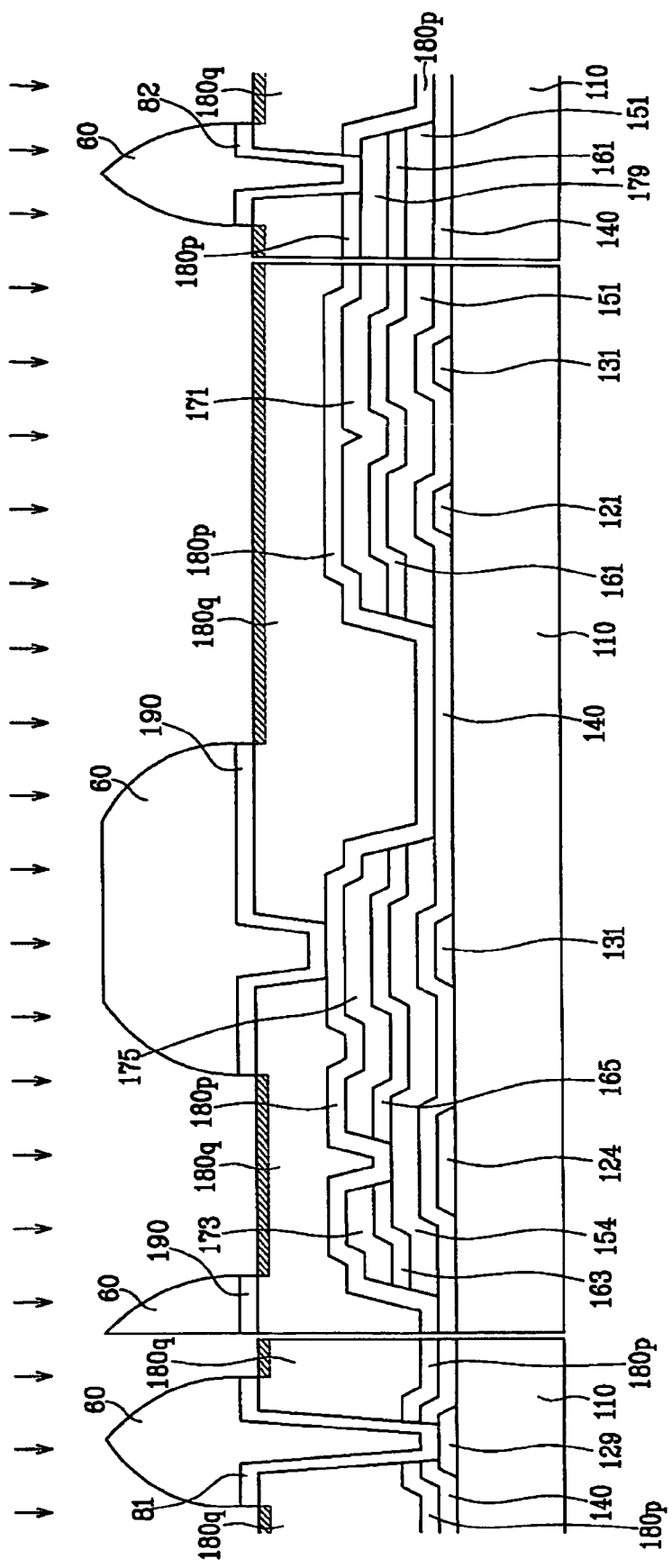
FIG. 29 is a sectional view of the TFT array panel in the step following the step shown in FIG. 28.

FIG. 18 is a layout view of a TFT array panel shown in FIGS. 16 and 17 in the first step of a manufacturing method thereof according to another embodiment of the present invention, FIG. 19 is a sectional view of the TFT array panel shown in FIG. 18 taken along the line XIX-XIX, FIGS. 20 and 21 are sectional views of the TFT array panel shown in FIG. 18 taken along the line XIX-XIX, and illustrate the step following the step shown in FIG. 19, FIG. 22 is a layout view of the TFT array panel in the step following the step shown in FIG. 21, FIG. 23 is a sectional view of the TFT array panel shown in FIG. 22 taken along the line XXIII-XXIII, FIG. 24 is a sectional view of the TFT array panel shown in FIG. 22 taken along the line XXIII-XXIII, and illustrates the step following the step shown in FIG. 23, FIG. 25 is a layout view of the TFT array panel in the step following the step shown in FIG. 24, FIG. 26 is a sectional view of the TFT array panel shown in FIG. 25 taken along the line XXVI-XXVI, FIG. 27 is a sectional view of the TFT array panel in the step following the step shown in FIG. 26, FIG. 28 is a sectional view of the TFT array panel in the step following the step shown in FIG. 27, and FIG. 29 is a sectional view of the TFT array panel in the step following the step shown in FIG. 28.

Referring to FIGS. 18 and 19, a plurality of gate lines 121 including a plurality of gate electrodes 124 and a plurality of storage electrode lines 131 are formed on a substrate 110 by depositing and photo-etching a conductive film.

Referring to FIG. 20, a gate insulating layer 140, an intrinsic a-Si layer 150, and an extrinsic a-Si layer 160 are sequentially deposited by CVD such that the layers 140, 150 and 160. A conductive layer 170 is deposited by sputtering, and a photoresist is coated on the conductive layer 170.

The photoresist is exposed to light through an exposure mask (not shown), and developed such that the developed photoresist has a position dependent thickness. The photoresist shown in FIG. 20 includes a plurality of first to third portions with decreased thickness. The first portions located on wire areas A and the second portions located on channel areas B are indicated by reference numerals 52 and 54, respectively, and no reference numeral is assigned to the third portions located on remaining areas C since they have substantially zero thickness to expose underlying portions of the conductive layer 170.

The exposure mask light transmitting areas, light blocking areas, and translucent areas corresponding to the remaining areas C, the wire areas A, and the channel areas B, respectively.

Next, as shown in FIG. 21, the exposed portions of the conductive layer 170 on the remaining areas B are removed by wet etching or dry etching using the photoresist 52 and 54 as an etch mask to expose the underlying the portions of the extrinsic a-Si layer 160.

Reference numeral 174 indicates portions of the conductive layer 170 including the data lines 171 and the drain electrode 175 connected to each other Next, the exposed portions of the extrinsic a-Si layer 160 on the areas B and of the intrinsic a-Si layer 150 are removed preferably by dry etching and the second portions 54 of the photoresist are removed to expose the portions of the conductors 174.

Residue of the second portions 54 of the photoresist remained on the channel areas B is removed by ashing.

The semiconductor stripes 151 are completed in this step, and reference numeral 164 indicates portions of the extrinsic a-Si layer 160 including the ohmic contact stripes and islands 161 and 165 connected to each other, which are called "extrinsic semiconductor stripes."

Referring to FIGS. 22 and 23, the portions of the conductors 174 and the extrinsic a-Si stripes 164 on the channel areas C as well as the first portion 52 of the photoresist are removed.

In this way, each conductor 174 is divided into a data line 171 and a plurality of drain electrodes 175 to be completed, and each extrinsic semiconductor stripe 164 is divided into an ohmic contact stripe 161 and a plurality of ohmic contact islands 165 to be completed.

Referring to FIG. 24, a lower passivation layer 180p preferably made of silicon nitride or silicon oxide is formed on the data lines 171, the drain electrodes 175, and the exposed portions of the semiconductor stripes 151, and an upper passivation layer 180q preferably made of photosensitive organic material having a good flatness characteristic, is formed thereon.

Referring to FIGS. 25 and 26, the upper and lower passivation layer 180p and 180q are etched along with the gate insulating layer 140 to form a plurality of contact holes 185, 181 and 182 exposing the drain electrodes 175, end portions 179 of the data lines 171, and end portions 129 of the gate lines 121, respectively, as shown in FIGS. 9-12.

Referring to FIGS. 27 and 28, a plasma treatment using Ar gas is performed on the exposed portions of the end portions 129 and 179 of the gate and the data lines 121 and 171, and the drain electrode 175, and the upper passivation layer 180q, and a conductive layer 90 preferably made of transparent material such as ITO, IZO and a-ITO (amorphous indium tin oxide) is deposited by sputtering. Then, a photoresist 60 is coated on the transparent conductive layer 90, and exposed and developed using a photo mask to exposed the portions of the transparent conductive layer 90, and the exposed portions of the transparent conductive layer 90 is etched using the photoresist 60 as an etch mask to form a plurality of pixel electrodes 190 and a plurality of contact assistants 81 and 82, as shown in FIGS. 13 and 14.

Referring to FIG. 29, the portions of the photoresist 60 and the upper passivation layer 180q are removed by ashing, to remove the charges formed in the exposed surface of the upper passivation layer 180q by the plasma treatment is removed. The hatching portion in FIG. 29 represents the portion of the upper passivation layer 180q removed by ashing, as shown in FIG. 15.

Finally, as shown in FIGS. 16 and 17, the photoresist 60 is removed on the upper passivation layer 180q.

Since the manufacturing method of the TFT array panel according to an embodiment simultaneously forms the data lines 171, the drain electrodes 175, the semiconductors 151, and the ohmic contacts 161 and 165 using one photolithography process, the manufacturing process is simplified by omitting a photolithography step as well as the effects of above described embodiment.

Then, a thin film array panel including a polysilicon and manufacturing methods thereof according to another embodiment of the present invention will be described with reference to the accompanying drawings.

Figure 30:
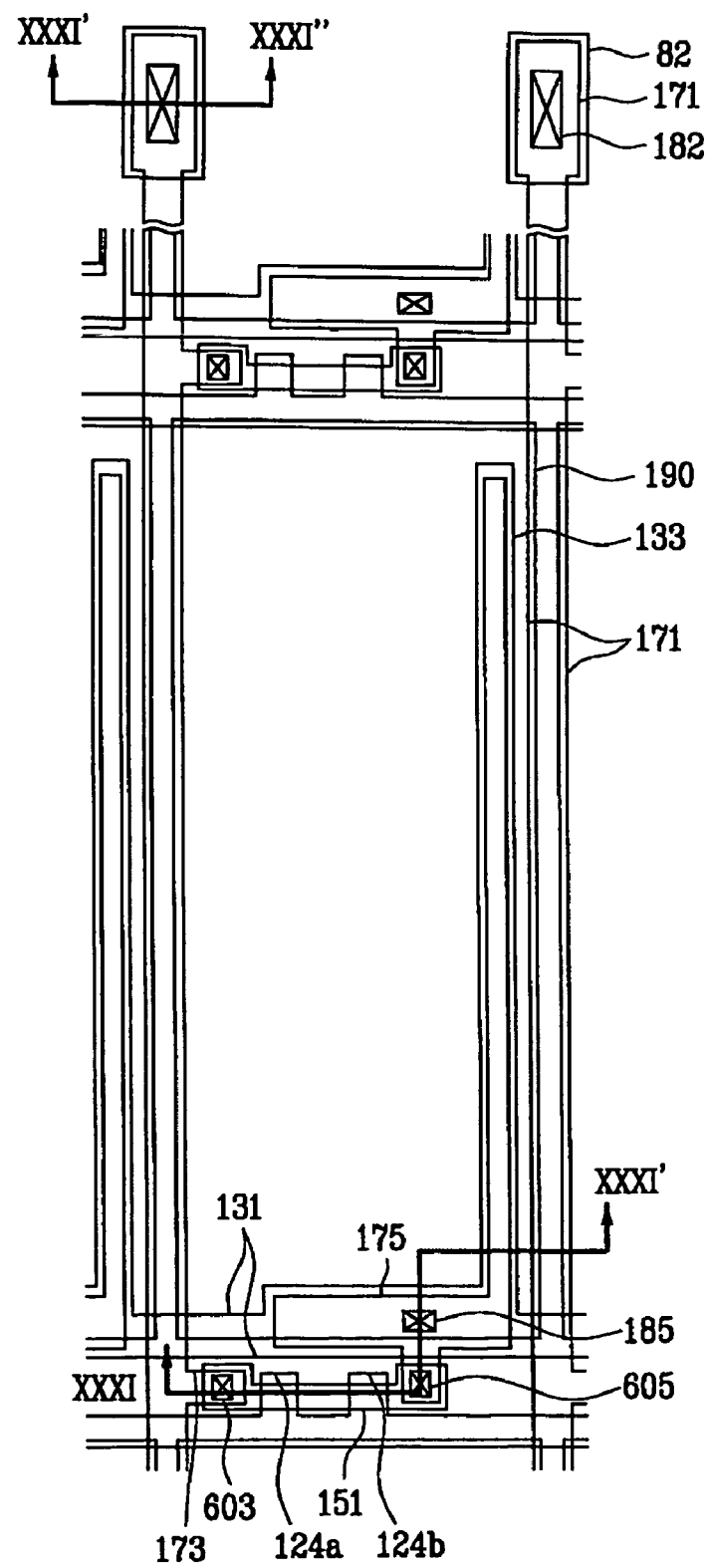
FIG. 30 is a layout view of the TFT array panel according to another embodiment of the present invention.
Figure 31:
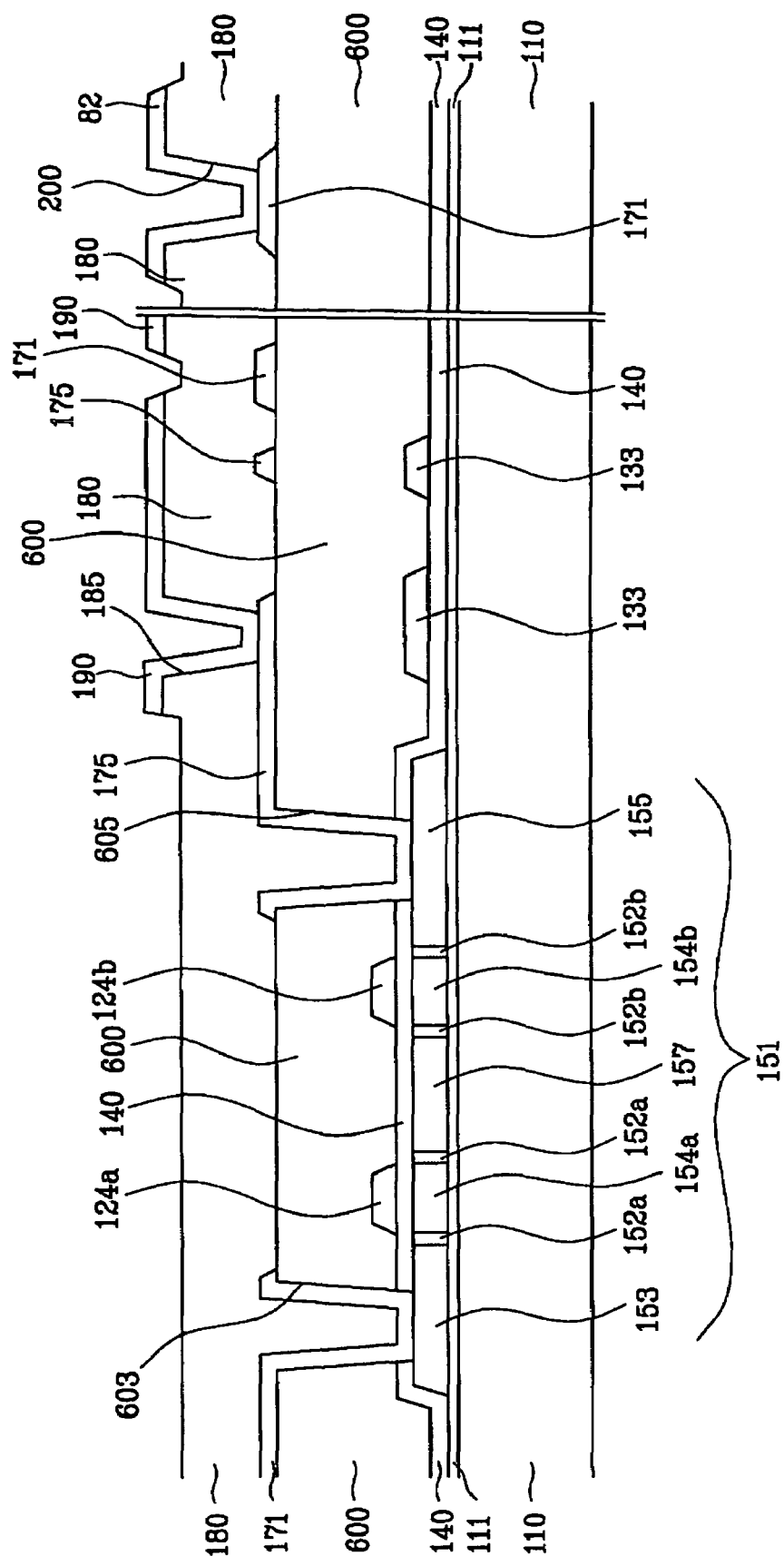
FIG. 31 is a sectional view of the display area shown in FIG. 30 taken along the lines XXXI-XXXI'-XXXI"

FIG. 30 is a layout view of the TFT array panel according to another embodiment of the present invention, and FIG. 31 is a sectional view of the display area shown in FIG. 30 taken along the lines XXXI-XXXI'-XXXI".

A blocking film 111 preferably made of silicon oxide ($SiO_2$) or silicon nitride (SiNx) is formed on an insulating substrate 110 such as transparent glass, quartz or sapphire. The blocking film 111 may have a dual-layered structure.

A plurality of semiconductor islands 151 preferably made of polysilicon is formed on the blocking film 111. Each of the semiconductor islands 151 extend substantially in a transverse direction and may have both end portions which a large area for contact with overlying conductive layer.

Each of the semiconductor islands 151 includes a plurality of extrinsic regions containing N type or P type conductive impurity and having heavily doped regions and lightly doped regions, and at least one intrinsic region hardly containing conductive impurity.

Concerning a semiconductor island 151, the intrinsic regions include a channel region 154a and 154b, and the extrinsic regions include a plurality of heavily doped regions such as source and drain regions 153 and 155 separated from each other with respect to the channel region 154a and 154b. The extrinsic region further includes dummy region 157 heavily doped, and a plurality of lightly doped regions 152a and 152b disposed between the intrinsic regions 154a and 157 and the heavily doped regions 153 and 155. Here, the number of the source and the drain regions may be various, and the number of the channel region may be various depend on the number of the source and the drain regions.

The lightly doped regions 152a and 152b have relatively small thickness and length compared with the heavily doped regions 153, 155 and 157 are disposed close to surfaces of the semiconductor islands 151. The lightly doped regions 152a and 152b disposed between heavily doped regions 153, 155 and 157 and the channel region 154a and 154b are referred to as "lightly doped drain (LDD) regions" and they prevent leakage current of TFTs. The LDD regions may be substituted with offset regions that contain substantially no impurity.

The impurity includes N type impurity such as phosphorous (P) and arsenic (As) and P type impurity such as boron (B) and gallium (Ga).

A gate insulating layer 140 made of silicon oxide ($SiO_2$) or silicon nitride (SiNx) is formed on the semiconductor islands 151.

A plurality of gate conductors including a plurality of gate lines 121, and a plurality of storage electrode lines 131 are formed on the gate insulating layer 140, respectively.

The gate lines 121 for transmitting gate signals extend substantially in a transverse direction and include a plurality of gate electrodes 124a and 124b protruding downward to respectively overlap the channel areas 154a and 154b of the semiconductor islands 151. Each gate line 121 may include an expanded end portion (not shown) having a large area for contact with another layer or an external driving circuit. The gate lines 121 may be directly connected to a gate driving circuit for generating the gate signals, which may be integrated on the substrate 110. The gate electrodes 124a and 124b may respectively overlap the lightly doped regions 152a and 152b.

The storage electrode lines 131 are supplied with a predetermined voltage such as a common voltage and include a plurality of storage electrodes 133 extended near the gate lines 121 adjacent thereto (called "previous gate lines").

The gate conductors 121 and 131 are preferably made of low resistivity material including Al containing metal such as Al and Al alloy (e.g. Al—Nd), Ag containing metal such as Ag and Ag alloy, Cu containing metal such as Cu and Cu alloy, Mo containing metal such as Mo and Mo alloy, Cr, Ti and Ta. The gate conductors 121, 131 and 124b may have a multi-layered structure including two films having different physical characteristics. One of the two films is preferably made of low resistivity metal including Al containing metal, Ag containing metal, and Cu containing metal for reducing signal delay or voltage drop in the gate conductors 121 and 131. The other film is preferably made of material such as Cr, Mo and Mo alloy, Ta or Ti, which has good physical, chemical, and electrical contact characteristics with other materials such as indium tin oxide (ITO) or indium zinc oxide (IZO). Good examples of the combination of the two films are a lower Cr film and an upper Al—Nd alloy film and a lower Al film and an upper Mo film.

In addition, the lateral sides of the gate conductors 121, 131 and 124b are inclined relative to a surface of the substrate 110 to enhancing the adhesion with an overlying layer.

An interlayer insulating layer 600 is formed on the gate conductors 121, 131 and 124b. The interlayer insulating layer 600 is preferably made of photosensitive organic material having a good flatness characteristic, low dielectric insulating material such as a-Si:C:O and a-Si:O:F formed by plasma enhanced chemical vapor deposition (PECVD), or inorganic material such as silicon nitride and silicon oxide.

The interlayer insulating layer 600 has a plurality of contact holes 603 and 605 respectively exposing the source regions 153 and 155.

A plurality of data conductors including a plurality of data lines 171 and a plurality of drain electrodes 175 are formed on the interlayer insulating layer 600.

The data lines 171 for transmitting data voltages extend substantially in the longitudinal direction and intersect the gate lines 121. Each data line 171 includes a plurality of source electrodes 173 connected to the source regions 153 through the contact holes 603. Each data line 171 includes an expanded end portion having a large area for contact with another layer or an external driving circuit. The data lines 171 may be directly connected to a data driving circuit for generating the gate signals, which may be integrated on the substrate 110. The storage electrodes 133 are disposed between the data lines 171 adjacent thereto.

The drain electrodes 175 are separated from the source electrodes 173 and connected to the drain regions 155 through the contact holes 605.

The data conductors 171 and 175 are preferably made of refractory metal including Cr, Mo, Ti, Ta or alloys thereof. They may have a multi-layered structure preferably including a low resistivity film and a good contact film. A good example of the multi-layered structure includes a Mo lower film, an Al middle film, and a Mo upper film as well as the above-described combinations of a Cr lower film and an Al—Nd upper film and an Al lower film and a Mo upper film.

Like the gate conductors 121 and 131, the data conductors 171 and 175 have tapered lateral sides relative to a surface of the substrate 110.

A passivation layer 180 is formed on the data conductors 171 and the interlayer insulating layer 600. The passivation layer 180 is also preferably made of photosensitive organic material having a good flatness characteristic, low dielectric insulating material such as a-Si:C:O and a-Si:O:F formed by PECVD, or inorganic material such as silicon nitride and silicon oxide.

The passivation layer 180 has a plurality of contact holes 185 and 182 respectively exposing the drain electrodes 175 and end portions of the data lines 171. The passivation layer 180 and the interlayer insulating layer 600 may further has a plurality of contact holes a plurality of contact holes (not shown) exposing end portions of the gate lines 121.

A plurality of pixel electrodes 190 and a plurality of contact assistance 82, which are preferably made of at least one of transparent conductor such as ITO or IZO and opaque reflective conductor such as Al or Ag, are formed on the passivation layer 180.

The pixel electrodes 190 are physically and electrically connected to the drain electrodes 175 through the contact holes 185 such that the pixel electrodes 190 receive the data voltages from the drain regions 155 via the drain electrodes 175.

The contact assistants 82 are connected to the end portions of the data lines 171 through the contact holes 182. The contact assistants 82 protect the end portions of the data lines 171 and complement the adhesion of the end portions of the data lines 171 and external devices.

The pixel electrodes 190 supplied with the data voltages generate electric fields in cooperation with the common electrode on the other panel (not shown), which determine orientations of liquid crystal molecules in a liquid crystal layer (not shown) disposed therebetween, or forms the current for emitting light in light-emitting layer disposed between two electrodes.

The pixel electrode 190 and the storage electrode line 131 including the storage electrodes 133 form a storage capacitor, and the storage electrode 133 may be omitted if necessity.

The pixel electrodes 190 overlap the gate lines 121 and the data lines 171 to increase aperture ratio but it is optional.

Now, a method of manufacturing the TFT array panel shown in FIGS. 30 and 31 according to an embodiment of the present invention will be now described in detail with reference to FIGS. 32A to 39 as well as FIGS. 30 and 31.

Figure 32A:
FIG. 32A is a layout view of the TFT array panel shown in FIGS. 30 and 31 in the first step of a manufacturing method thereof according to an embodiment of the present invention.
Figure 32A:
Figure 32A:
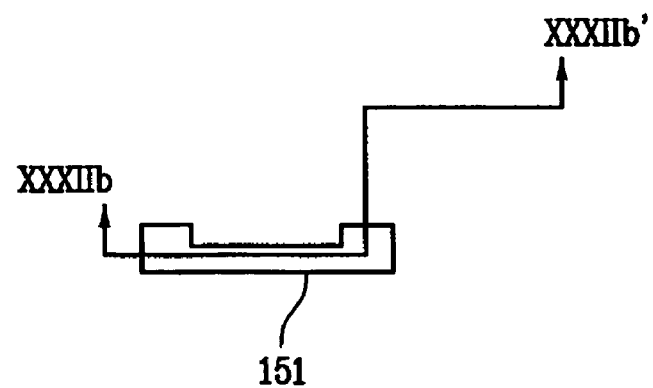
Figure 32B:
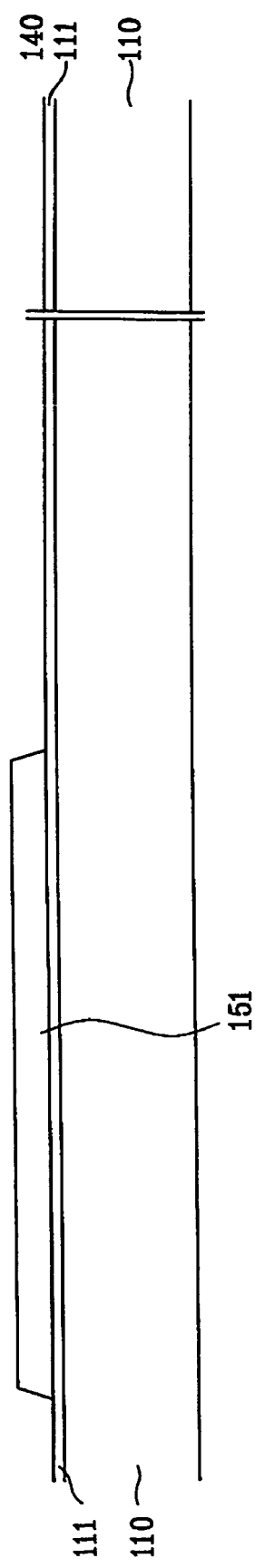
FIG. 32B is a sectional view of the TFT array panel shown in FIG. 32A taken along the lines XXXIIB-XXXIIB'-XXIIb"
Figure 33A:
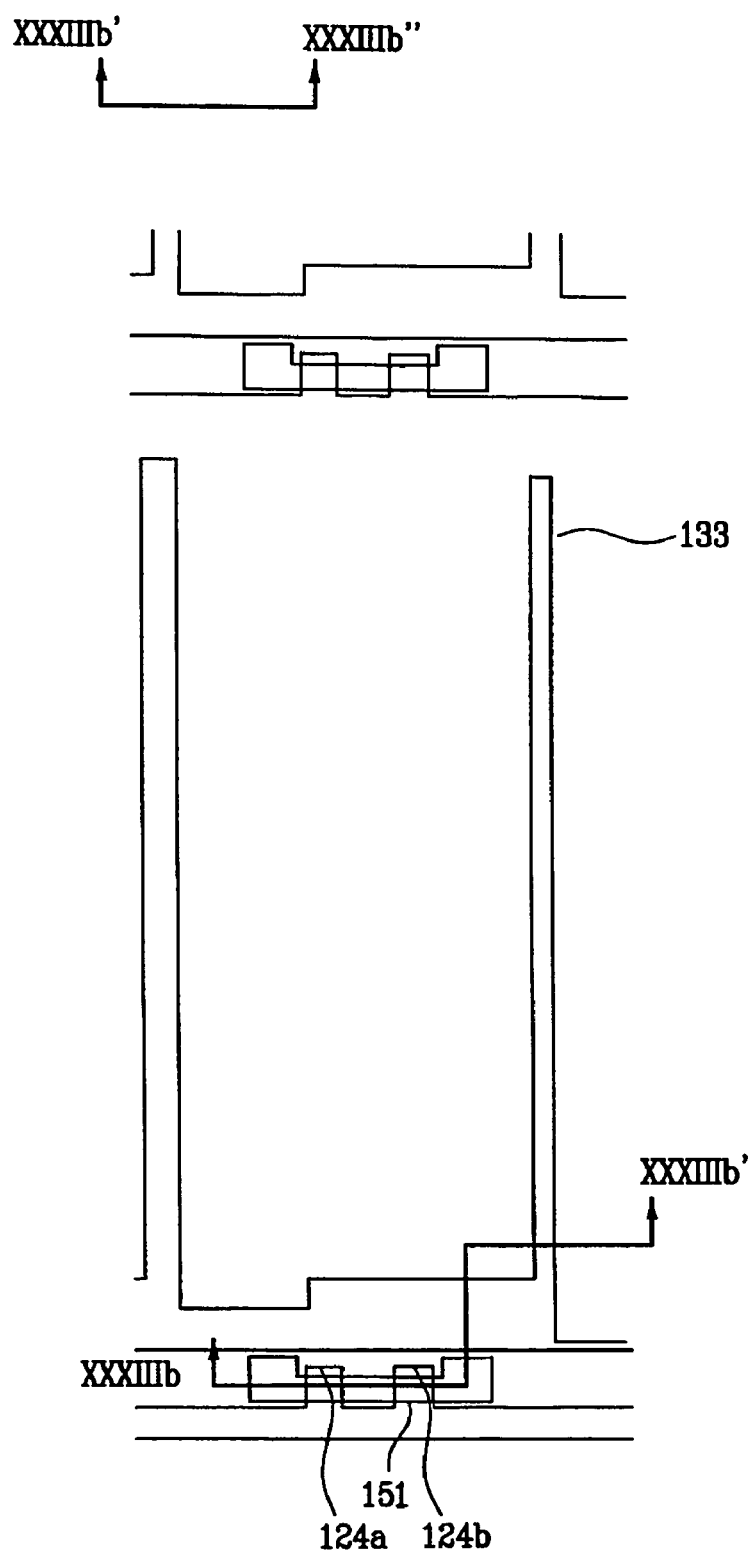
FIG. 33A is a layout view of the TFT array panel in the step following the step shown in FIG. 32A.
Figure 33B:
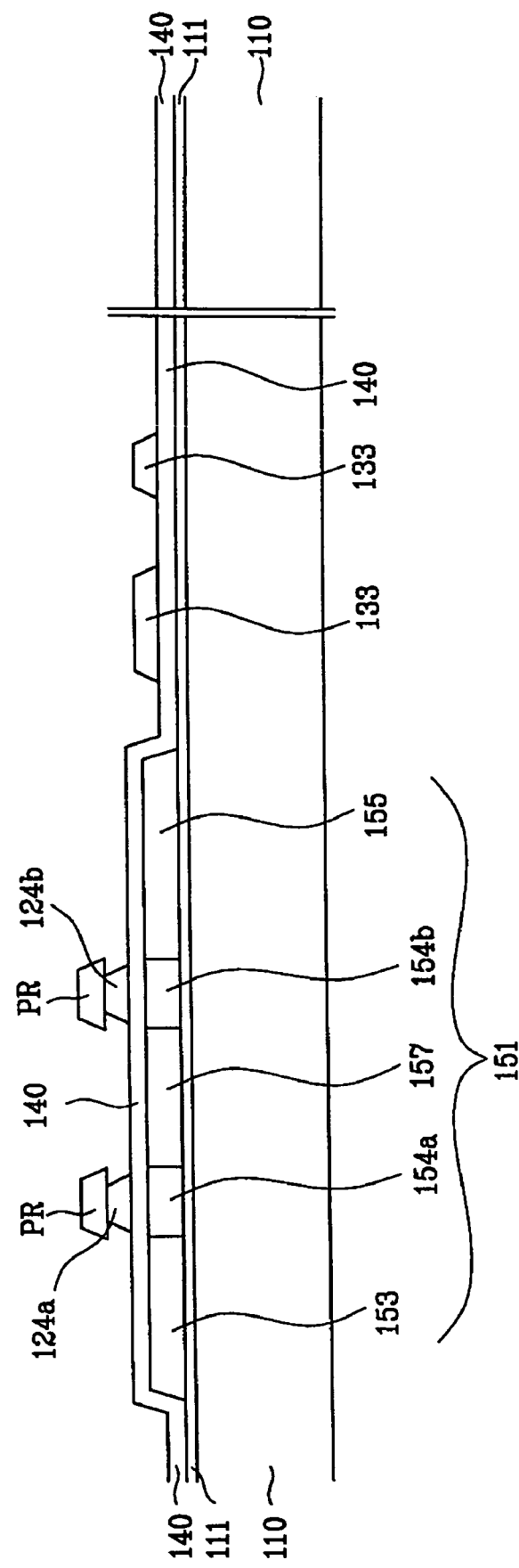
FIG. 33B is a sectional view of the TFT array panel shown in FIG. 33A taken along the line XXXIIIB-XXXIIIB'-XXXIIIB"
Figure 34:
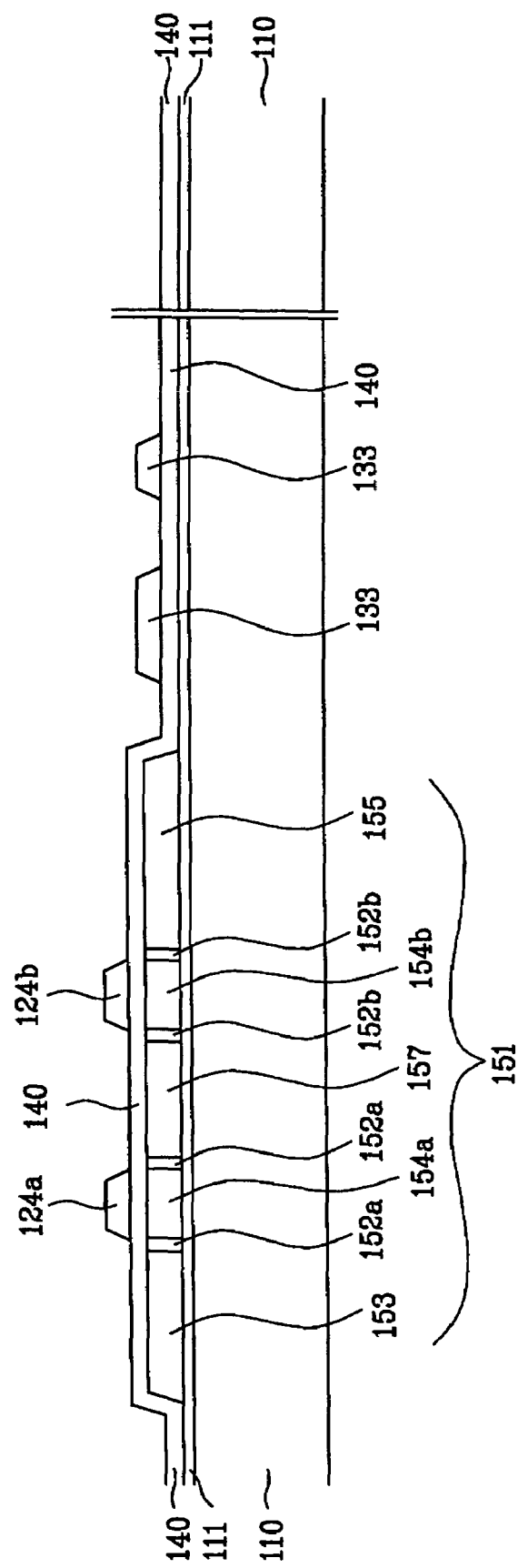
FIG. 34 is a sectional view of the TFT array panel shown in FIG. 33A taken along the line XXXIIIB-XXXIIIB'-XXXIIIB", and illustrates the step following the step shown in FIG. 33B.
Figure 35A:
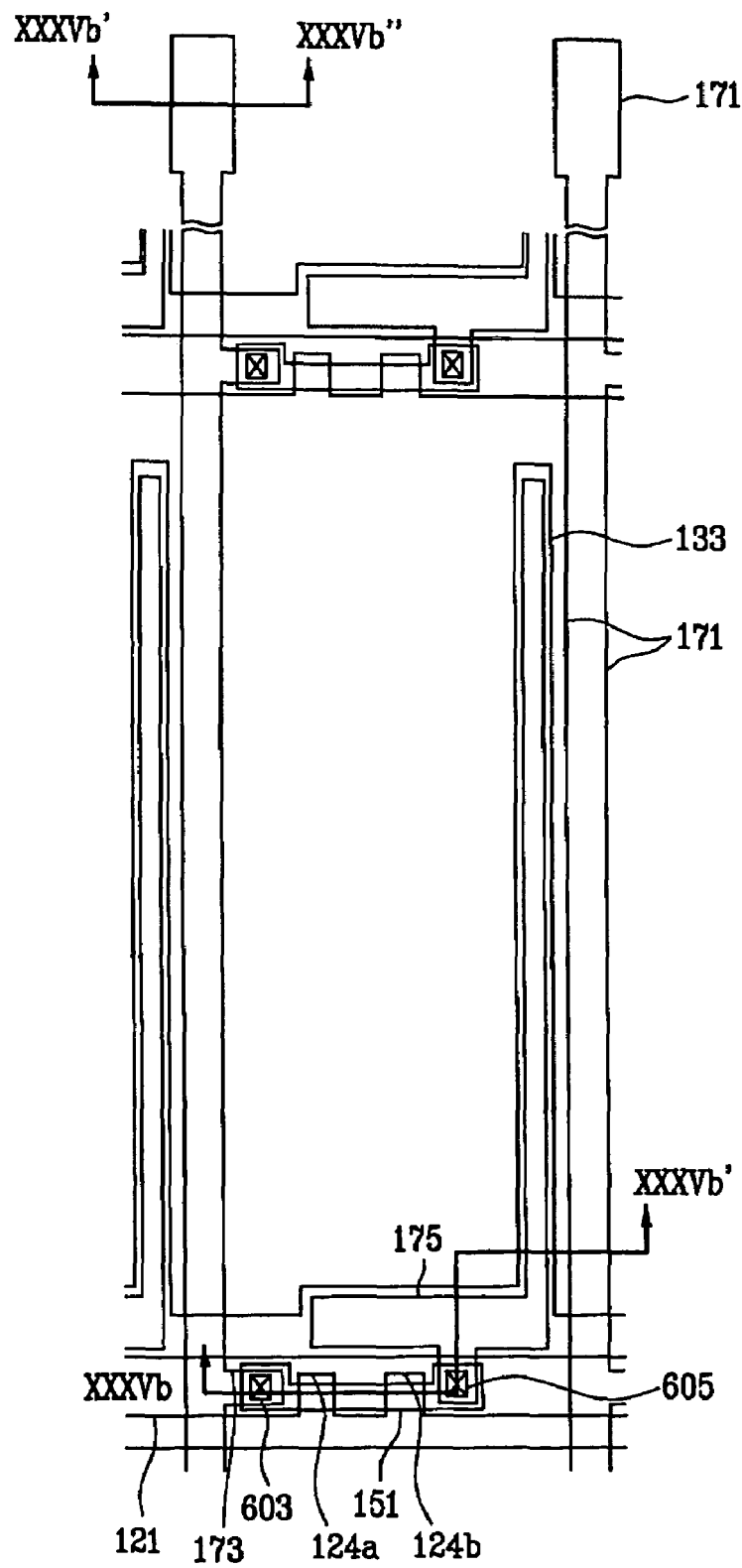
FIG. 35A is a layout view of the TFT array panel in the step following the step shown in FIG. 34.
Figure 35B:
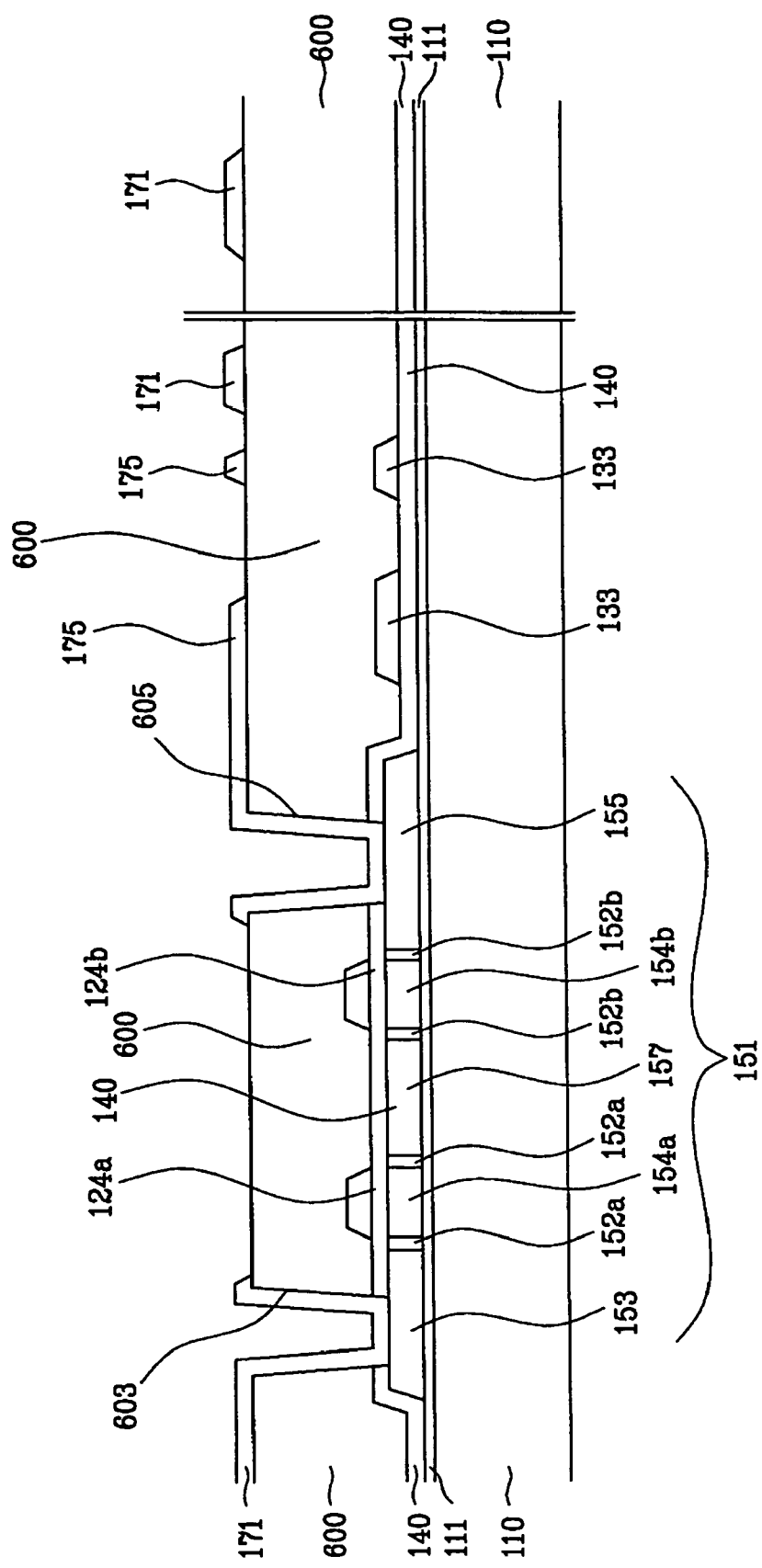
FIG. 35B is a sectional view of the TFT array panel shown in FIG. 35A taken along the line XXXVB-XXXVB'-XXXVB"
Figure 36A:
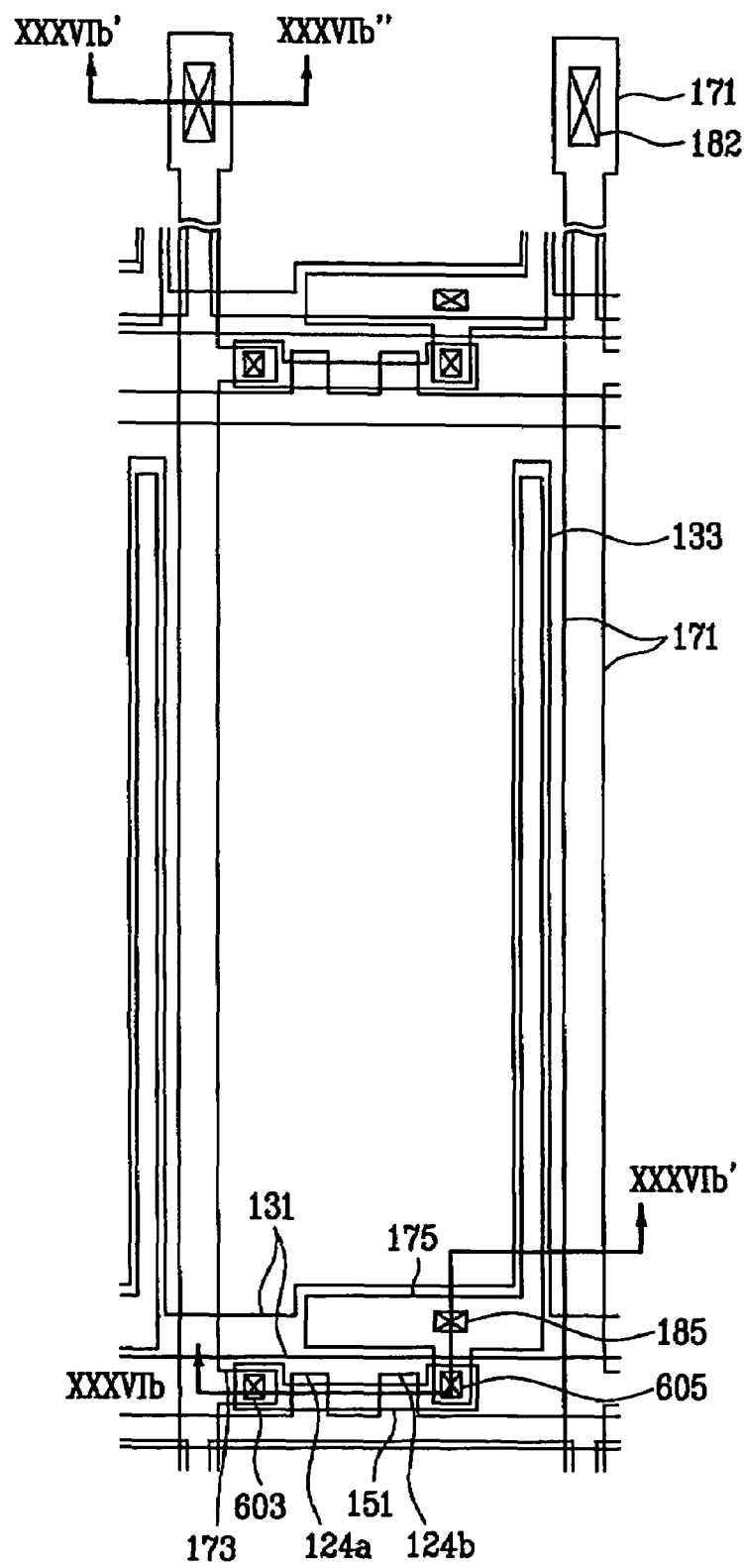
FIG. 36A is a layout view of the TFT array panel in the step following the step shown in FIG. 35A.
Figure 36B:
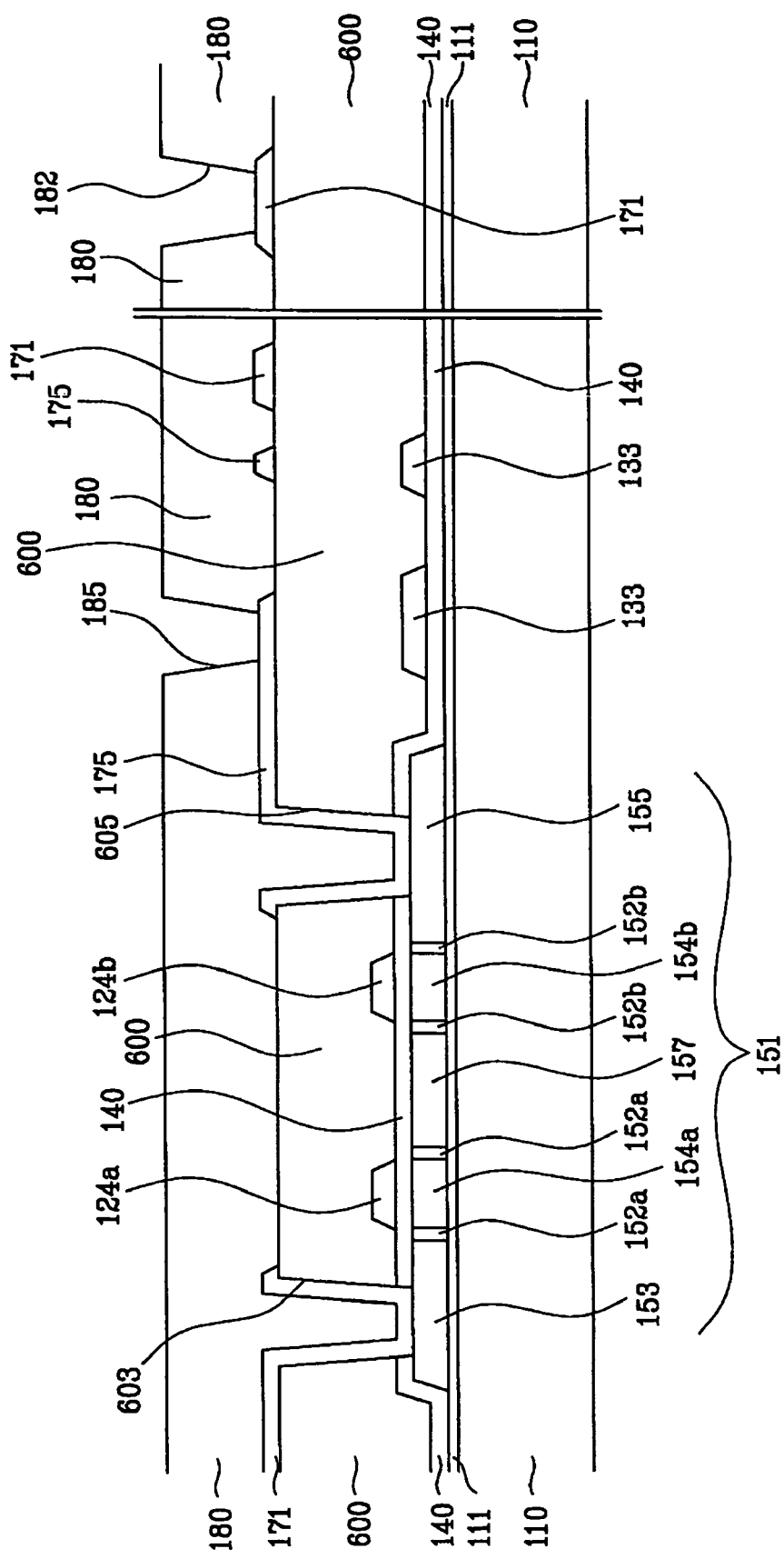
FIG. 36B is a sectional view of the TFT array panel shown in FIG. 36A taken along the line XXXVIB-XXXVIB'-XXXVIB"
Figure 37:
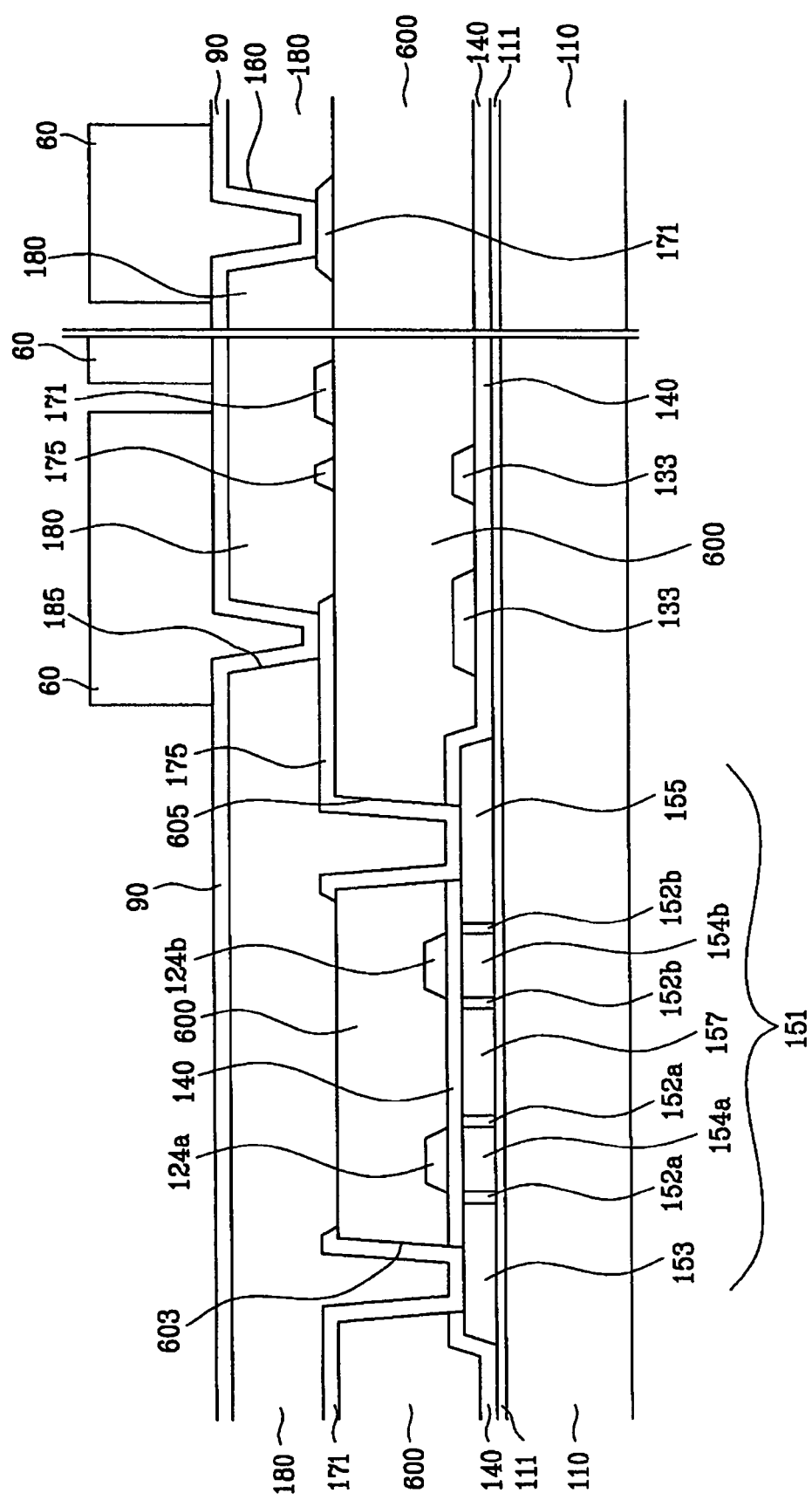
FIG. 37 is a sectional view of the TFT array panel shown in FIG. 36A taken along the line XXXVIB-XXXVIB'-XXXVIB", and illustrates the step following the step shown in FIG. 36B.
Figure 38:
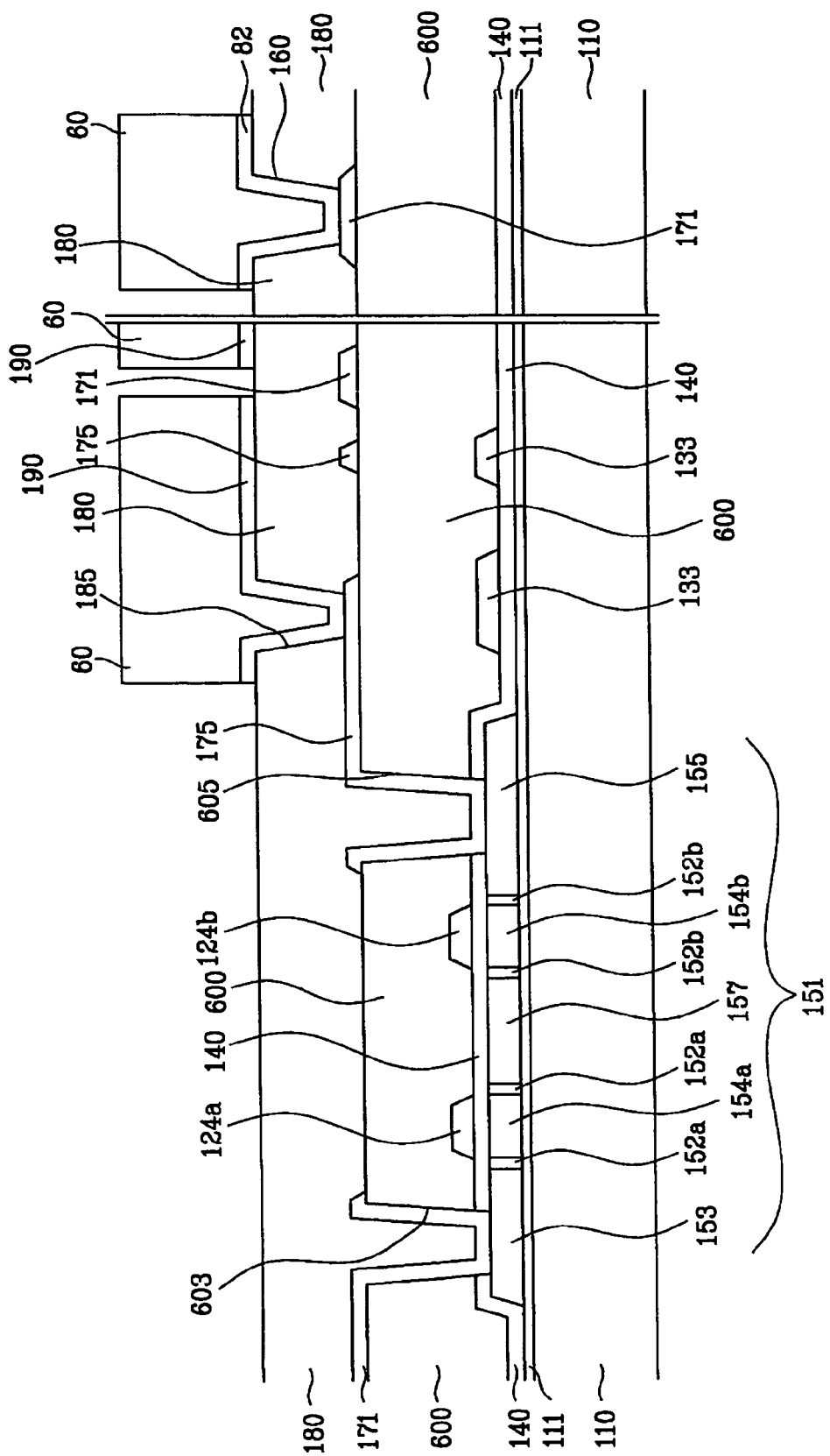
FIG. 38 is a sectional view of the TFT array panel shown in FIG. 36A taken along the line XXXVIB-XXXVIB'-XXXVIB", and illustrates the step following the step shown in FIG. 37.
Figure 39:
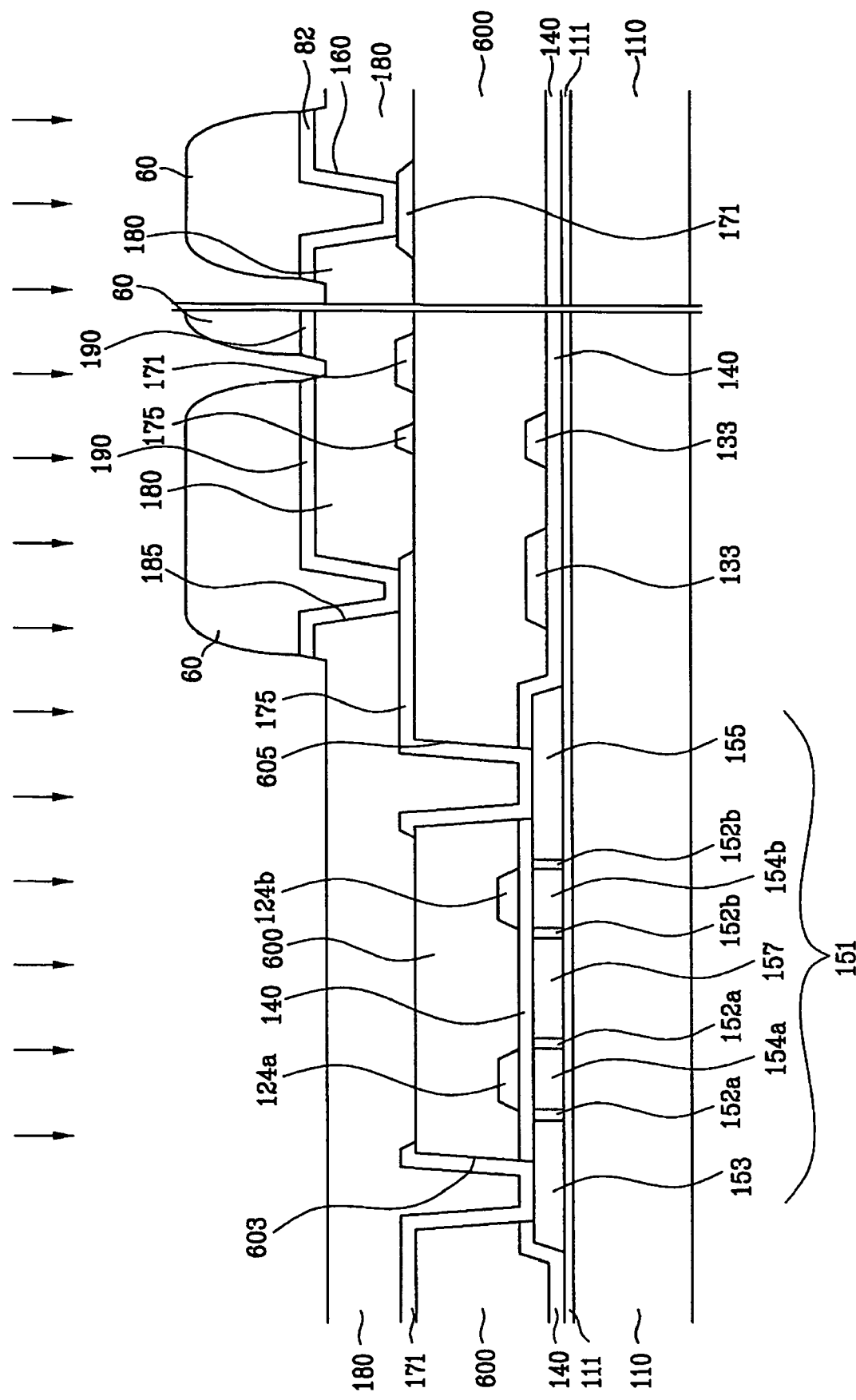
FIG. 39 is a sectional view of the TFT array panel shown in FIG. 36A taken along the line XXXVIB-XXXVIB'-XXXVIB", and illustrates the step following the step shown in FIG. 38.

FIG. 32A is a layout view of the TFT array panel shown in FIGS. 30 and 31 in the first step of a manufacturing method thereof according to an embodiment of the present invention, FIG. 32B is a sectional view of the TFT array panel shown in FIG. 32A taken along the lines XXXIIB-XXXIIB'-XXXIIB", FIG. 33A is a layout view of the TFT array panel in the step following the step shown in FIG. 32A, FIG. 33B is a sectional view of the TFT array panel shown in FIG. 33A taken along the line XXXIIIB-XXXIIIB'-XXXIIIB", FIG. 34 is a sectional view of the TFT array panel shown in FIG. 33A taken along the line XXXIIIB-XXXIIIB'-XXXIIIB", and illustrates the step following the step shown in FIG. 33B, FIG. 35A is a layout view of the TFT array panel in the step following the step shown in FIG. 34, FIG. 35B is a sectional view of the TFT array panel shown in FIG. 35A taken along the line XXXVB-XXXVB'-XXXVB", FIG. 36A is a layout view of the TFT array panel in the step following the step shown in FIG. 35A, and FIG. 36B is a sectional view of the TFT array panel shown in FIG. 36A taken along the line XXXVIB-XXXVIB'-XXXVIB", FIG. 37 is a sectional view of the TFT array panel shown in FIG. 36A taken along the line XXXVIB-XXXVIB'-XXXVIB", and illustrates the step following the step shown in FIG. 36B, FIG. 38 is a sectional view of the TFT array panel shown in FIG. 36A taken along the line XXXVIB-XXXVIB'-XXXVIB", and illustrates the step following the step shown in FIG. 37, and FIG. 39 is a sectional view of the TFT array panel shown in FIG. 36A taken along the line XXXVIB-XXXVIB'-XXXVIB", and illustrates the step following the step shown in FIG. 38.

Referring to FIGS. 32A and 32B, a blocking film 111 is formed on an insulating substrate 110, and a semiconductor layer preferably made of amorphous silicon is deposited thereon. The semiconductor layer is then crystallized by laser annealing, furnace annealing, or solidification and patterned by lithography and etching to form a plurality of semiconductor islands 151.

Referring to FIGS. 33A and 33B, a gate insulating layer 140 preferably made of silicon oxide or silicon nitride is deposited and a gate conductor film is deposited in sequence thereon.

Next, a photoresist (PR) is formed on the gate conductor film, and the gate conductor film are patterned using the photoresist PR as an etch mask to form a plurality of gate conductors that include a plurality of gate lines 121 including gate electrodes 124a and 124b and a plurality of storage electrode lines 131. At this time, it is preferable that an over etch is executed, and the over-etch makes edges of the gate conductors 121 and 131 lie within edges of the photoresist PR.

Next, high-concentration N or P type impurity is introduced with a low energy of about 3-40 eV into the semiconductor islands 151 by PECVD or plasma emulsion such that regions of the semiconductor islands 151 disposed under the photoresist PR are not doped and remaining regions of the semiconductor islands 151 is heavily doped, thereby forming source and drain regions 153 and 155 and dummy regions 157 as well as channel regions 154a and 154b. The low energy prevents the damage due to high voltage for generating high energy to stabilize the characteristics of TFTs. The photoresist may be removed after the doping process.

Referring to FIG. 34, the photoresist PR is removed and low-concentration N or P type impurity is implanted with a high energy into the semiconductor islands 151 by using a scanning equipment or an ion beam equipment such that regions of the semiconductor islands 151 disposed under the gate conductors 121 and 131 are not doped and remaining regions of the semiconductor islands 151 are doped to form lightly doped regions 152a and 152b at upper side portion of the channel regions 154a and 154b. To form the lightly doped regions 152a and 152b, a spacer formed at the sides of the gate electrode 124a may be used, and the gate conductors 121 and 131 may have double-layered structure including metals having different etch rate.

Referring to FIGS. 35A and 35B, an interlayer insulating layer 600 is deposited and patterned to form a plurality of contact holes 603 and 605 exposing the source regions 153 and the drain regions 155.

Nest, a plurality of data conductors including a plurality of data lines 171 including source electrodes 173 and a plurality of drain electrodes 175 are formed on the interlayer insulating layer 600.

Referring to FIGS. 36A and 36B, a passivation layer 180 preferably made of photosensitive organic material having a good flatness characteristic, is formed thereon and patterned to form a plurality of contact holes 185 and 182 exposing the drain electrodes 175 and the end portions of the data lines 171.

Referring to FIGS. 37 and 38, a plasma treatment using Ar gas is performed on the exposed portions of the end portions of the data lines 171 and the drain electrode 175, and the passivation layer 180, and a conductive layer 90 preferably made of transparent material is deposited by sputtering. Then, a photoresist 60 is coated on the transparent conductive layer 90, and exposed and developed using a photo mask to exposed the portions of the transparent conductive layer 90, and the exposed portions of the transparent conductive layer 90 is etched using the photoresist 60 as an etch mask to form a plurality of pixel electrodes 190 and a plurality of contact assistants 82.

Referring to FIG. 39, the portion of the photoresist 60 and the passivation layer 180 are removed by ashing, to remove the charges accumulated in the exposed surface of the upper passivation layer 180 by the plasma treatment.

Finally, as shown in FIGS. 30 and 31, the photoresist 60 is removed on the passivation layer 180.

As described above, the exposed surface of the passivation layer 180q is removed to eliminate the charges formed by the plasma treatment after etching the transparent conductive layer for pixel electrodes and a plurality of contact assistants, thereby preventing the deterioration of the quality of the LCD due to the charges.

Furthermore, since the manufacturing method of the TFT array panel according to an embodiment simultaneously forms the data lines, the semiconductors, and the ohmic contacts using one photolithography process, the manufacturing process is simplified.

The above descriptions may be adapted to other flat panel display devices such as OLED.

While the present invention has been described in detail with reference to the preferred embodiments, those skilled in the art will appreciate that various modifications and substitutions can be made thereto without departing from the spirit and scope of the present invention as set forth in the appended claims.

What is claimed is:

1. A method of manufacturing a thin film transistor array panel, the method comprising:
   forming a thin film transistor including a gate electrode, a drain electrode, a source electrode and a semiconductor on a substrate;
   forming a first passivation layer on the drain and the source electrodes;
   forming a transparent conductive layer on the first passivation layer;
   etching the transparent conductive layer using a photoresist as an etch mask to expose a portion of the first passivation layer and to form a pixel electrode connected the drain electrode;
   ashing the first passivation layer and the photoresist, wherein the ashing the first passivation layer forms a step on the passivation layer, and wherein the step does not overlap the pixel electrode; and
   removing the photoresist.

2. The method of claim 1, wherein the ashing of the first passivation layer and the photoresist is performed until the exposed surface of the first passivation layer from the pixel electrode is lower than the surface of the first passivation layer under the pixel electrode.

3. The method of claim 2, wherein the first passivation layer includes an organic material.

4. The method of claim 2, further comprising:
   forming an ohmic contact layer between the semiconductor and the source and the drain electrodes.

5. The method of claim 4, wherein the formation of the source and the drain electrode, the ohmic contact layer, and the semiconductor comprises:
   depositing an intrinsic silicon layer and an extrinsic silicon layer;
   etching the intrinsic silicon layer and the extrinsic silicon layer to form the semiconductor and the extrinsic semiconductor;
   forming a conductor layer;
   etching the conductor layer to form the source and the drain electrodes; and
   etching the extrinsic semiconductor exposed between the source electrode and the drain electrode to form the ohmic contact layer.

6. The method of claim 4, wherein the formation of the data line and the drain electrode, the ohmic contact layer, and the semiconductor comprises:
   depositing an intrinsic silicon layer and an extrinsic silicon layer;
   forming a conductor layer on the extrinsic silicon layer;
   etching the intrinsic silicon layer and the extrinsic silicon layer to form the semiconductor and the extrinsic semiconductor;
   etching the conductor layer to form the source and the drain electrodes; and
   etching the extrinsic semiconductor exposed between the source electrode and the drain electrode to form the ohmic contact layer.

7. The method of claim 1, wherein the formation of the thin film transistor further includes a formation of a second passivation layer.

8. The method of claim 7, wherein the second passivation layer includes an inorganic material.

9. A method of manufacturing a thin film transistor array panel, the method comprising:

forming a semiconductor including extrinsic regions and intrinsic regions;

forming a gate insulating layer covering the semiconductor;

forming a gate line overlapping the intrinsic regions of the semiconductor;

forming an interlayer insulating layer covering the gate line and the gate insulating layer;

forming a data line and a drain electrode respectively connected to the extrinsic regions of the semiconductor;

forming a passivation layer covering the data line and the drain electrode;

forming a transparent conductive layer on the passivation layer;

etching the transparent conductive layer using a photoresist as an etch mask to expose a portion of the passivation layer and to form a pixel electrode connected the drain electrode;

ashing the passivation layer and the photoresist, wherein the ashing the first passivation layer forms a step on the passivation layer, and wherein the step does not overlap the pixel electrode; and removing the photoresist.

10. The method of claim 9, wherein the ashing of the passivation layer and the photoresist is performed until the exposed surface of the passivation layer from the pixel electrode is lower than the surface of the passivation layer under the pixel electrode.

11. The method of claim 9, wherein the passivation layer includes an organic material.

* * * * *